United States Patent
Kobayashi et al.

(10) Patent No.: US 8,116,114 B2
(45) Date of Patent: Feb. 14, 2012

(54) SEMICONDUCTOR MEMORY AND SYSTEM

(75) Inventors: Hiroyuki Kobayashi, Kawasaki (JP); Daisuke Kitayama, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 217 days.

(21) Appl. No.: 12/684,502

(22) Filed: Jan. 8, 2010

(65) Prior Publication Data

US 2010/0142250 A1 Jun. 10, 2010

Related U.S. Application Data

(63) Continuation of application No. PCT/JP2007/000753, filed on Jul. 11, 2007.

(51) Int. Cl.
*G11C 5/06* (2006.01)
(52) U.S. Cl. ............................ 365/63; 365/190; 365/201
(58) Field of Classification Search .............. 365/189.17
See application file for complete search history.

(56) References Cited

U.S. PATENT DOCUMENTS 5,745,420 A * 4/1998 McClure ........................ 365/201
6,301,169 B1 * 10/2001 Kikuda et al. ................. 365/201
7,768,840 B1 * 8/2010 Aleksanyan et al. ..... 365/189.02

FOREIGN PATENT DOCUMENTS

JP 07-130197 A 5/1995
JP 2002-319299 A 10/2002
JP 2005-285248 A 10/2005

* cited by examiner

*Primary Examiner* — Tan T. Nguyen
(74) *Attorney, Agent, or Firm* — Arent Fox LLP

(57) ABSTRACT

A pair of access control circuits having bit line pairs wired corresponds to a same data terminal and is assigned different addresses. During a test mode, a data swap circuit prohibits swapping of connections between a pair of data terminals and a pair of data lines when one of the access control circuits is used, and swaps the connections between a pair of data terminals and a pair of data lines when the other one of the access control circuits is used. Accordingly, it is possible to give a data signal at the same logic level to bit lines with different logics from each other. Stress can be given between a contact arranged between a pair of the access control circuits and bit lines adjacent to both sides of the contact. Consequently, designing of a test pattern can be simplified, and test efficiency can be improved.

10 Claims, 17 Drawing Sheets

US 8,116,114 B2

SEMICONDUCTOR MEMORY AND SYSTEM

CROSS-REFERENCE TO RELATED APPLICATION

This application is based upon and claims the benefit of the prior International Application No. PCT/JP2007/000753, filed on Jul. 11, 2007, the entire contents of which are incorporated herein by reference.

FIELD

The present embodiments relate to a semiconductor memory and a system having a controller accessing this semiconductor memory.

BACKGROUND

In a semiconductor memory such as a DRAM, memory cells arranged in a matrix form are coupled to one of complementary bit lines. In a test process of this type of semiconductor memory, for example, for detecting a leak failure or the like between memory cells or bit lines, data of arbitrary logic (test pattern) is written in memory cells MC. In another way, a test pattern which easily causes noise is written in memory cells for evaluating an operation margin. Here, for performing a test without generating a complicated test pattern, there is proposed an approach to write a data signal supplied to one data terminal in the memory cells corresponding to another data terminal depending on an address signal supplied as a test pattern (see, for example, Japanese Laid-open Patent Publication No. H7-130197). Alternatively, there is proposed an approach to assign the bit numbers of plural data terminals to bits of an address signal during a test mode, and invert the logic of a data signal supplied to the data terminals depending on an address signal supplied as a test pattern (see, for example, Japanese Laid-open Patent Publication No. 2002-319299).

In recent years, accompanying miniaturization of transistor structures, there is a tendency that the gap between a contact of a voltage line supplied to a sense amplifier or a voltage line supplied to a precharge circuit and a bit line becomes narrow. Accordingly, leak failures are more liable to occur between these wirings.

SUMMARY

According to an aspect of the invention, a semiconductor memory includes a plurality of data terminals; a plurality of complementary bit line pairs extending along a first direction, arranged toward a second direction orthogonal to the first direction, and corresponding to the respective data terminals; a plurality of memory cells coupled to respective bit lines of the bit line pairs; a plurality of access control circuits each having the bit line pairs wired therein and operating when the memory cells are accessed; a contact arranged between the access control circuits adjacent to each other and supplying a voltage to nodes in the access control circuits; a plurality of data lines provided corresponding respectively to the respective data terminals and coupled in common to the access control circuits corresponding to the data terminals; and a data swap circuit which is arranged between the data lines and the data terminals and swapping connections between a pair of the data terminals and a pair of the data lines corresponding to the pair of the data terminals, in which at least a pair of the access control circuits adjacent to each other is assigned a same number of a data terminal, and is assigned different addresses; and during a test mode, the data swap circuit prohibits swapping of the connections when the memory cells corresponding to one of the access control circuits of a pair are accessed, and swaps the connections when the memory cells corresponding to the other one of the access control circuits of the pair are accessed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
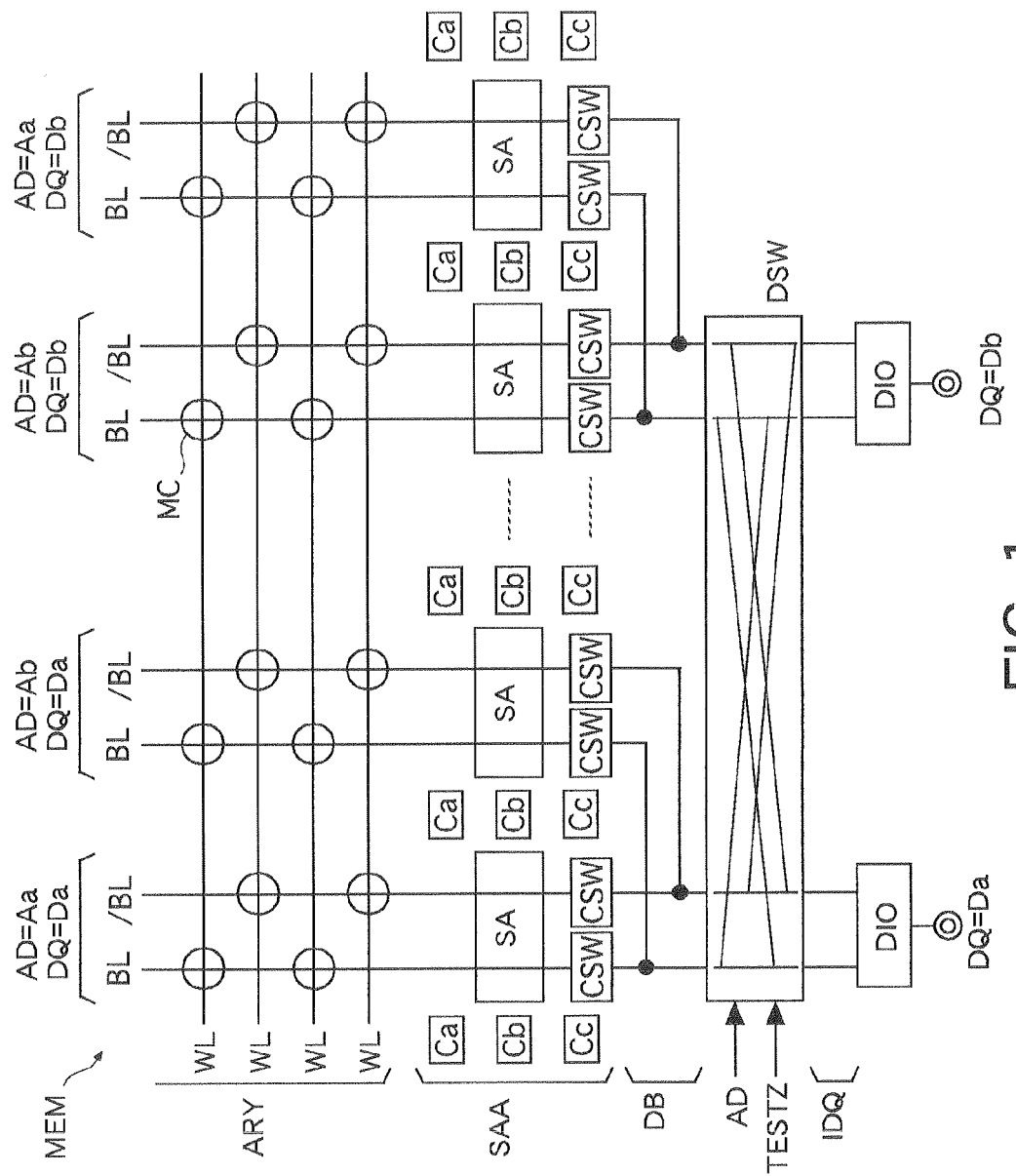
FIG. 1 is a block diagram illustrating a substantial part of a semiconductor memory in a first embodiment of the present embodiment.

For example, for reducing the layout size of a control circuit such as a sense amplifier, a precharge circuit, or the like (hereinafter also referred to as an access control circuit) arranged in what is called a sense amplifier area, arranging a common contact for the aforementioned voltage lines between access control circuits adjacent to each other is performed. For example, when two access control circuits which correspond to the same data terminal and are assigned different addresses from each other are adjacent to each other, the common contact is adjacent to a bit line pair BL wired in one access control circuit and to a bit line /BL wired in the other sense amplifier. When evaluating leak characteristics of the common contact and the bit lines BL, /BL adjacent to the common contact, it is desirable that both the bit lines BL, /BL are set to the voltage level inverse to a voltage level supplied to the common contact, so as to increase test efficiency. That is, the logic level of the data signal supplied to one access control circuit and the logic level of the data signal supplied to the other access control circuit need to be reverse to each other.

However, in such a situation, it is necessary that data signals with logics reverse to each other are written in the data terminal depending on the address signal, and it is necessary that the test pattern of data signals includes the logic of the address signal. Consequently, the test pattern for evaluating the leak characteristics increases, and the test efficiency decreases.

A proposition of the present invention is to improve test efficiency in a semiconductor memory having a pair of access control circuits corresponding to a same data terminal and arranged adjacent to each other by easily writing data with logics inverse to each other in these access control circuits.

In one aspect of the present embodiment, a plurality of complementary bit line pairs corresponding to respective data terminals extend along a first direction and are arranged toward a second direction orthogonal to the first direction. A plurality of memory cells coupled to respective bit lines of the bit line pairs. A plurality of access control circuits each has the bit line pairs wired therein and operate when the memory cells are accessed. A contact supplying a voltage to nodes in the access control circuits is arranged between the access control circuits adjacent to each other. A plurality of data lines are provided corresponding to the respective data terminals and coupled in common to the access control circuits corresponding to the data terminals.

A data swap circuit is arranged between the data lines and the data terminals and swaps connections between a pair of the data terminals and a pair of the data lines corresponding to the pair of the data terminals. Specifically, during a test mode, the data swap circuit prohibits swapping of the connections when the memory cells corresponding to one of the access control circuits of a pair are accessed, and swaps the connections when the memory cells corresponding to the other one of the access control circuits of the pair are accessed. A pair of the access control circuits adjacent to each other is assigned a same number of a data terminal, and is assigned different addresses. For example, during the test mode, the data swap circuit prohibits or permits swapping of the connections depending on an address signal for selecting the bit line pairs and the access control circuit.

In a pair of the access control circuits, logics of the bit lines adjacent to the contact are different from each other. However, without changing a logic of a data signal to be supplied to the data terminals, it is possible to give the data signal at the same logic level to the bit lines with different logics from each other by the data swap circuit. That is, designing of a test pattern becomes simple. Further, in the test mode, it is possible to give stress between the contact and the bit lines adjacent to both sides of the contact without changing the test pattern of the data signal. Consequently, test efficiency can be improved and test costs can be reduced.

For example, the semiconductor memory forms a system together with a controller accessing the semiconductor memory. The controller outputs a test control signal to the semiconductor memory. The semiconductor memory enters the test mode depending on the test control signal output from the controller.

In a preferred example in one aspect of the present embodiment, the bit line pairs corresponding to the respective data terminals are arranged in areas separated from each other. That is, in the semiconductor memory having a memory cell array sectioned by every data terminals, test efficiency can be improved and test costs can be reduced.

In a preferred example in one aspect of the present embodiment, a plurality of access control circuit groups are assigned different addresses, and each have a pair of the access control circuits corresponding to a pair of the data terminals. In a pair of the access control circuit groups adjacent to each other, an order of numbers of data terminals assigned to the access control circuits lined up in the second direction is in reverse order. Among four of the access control circuits in a pair of the access control circuit groups, two of the access control circuits having assigned different addresses and corresponding to one of the data terminals are arranged at positions adjacent to each other. For example, the contact supplying a voltage to a node in common to the pair of the access control circuit groups is arranged between a pair of the access control circuit groups. A pair of the access control circuit groups adjacent to each other is laid out in a mirror symmetry. That is, in the semiconductor memory having the access control circuit groups in the mirror symmetry, test efficiency can be improved and test costs can be reduced.

In a preferred example in one aspect of the present embodiment, a write amplifier is arranged between the data lines and the data terminals to transmit a write data signal received at the data terminals to the bit lines. The data swap circuit is arranged between the write amplifier and the data terminals. Generally, in layout areas of the memory cell array and the access control circuits, basic circuit blocks are arranged repeatedly, and transistors, wirings, and so on are arranged in high density. Accordingly, when the data swap circuit is inserted in these layout areas, a large layout change is needed. On the other hand, the side of the data terminals of the write amplifier often has a room for inserting a circuit. Thus, the data swap circuit can be arranged on the side of the data terminals of the write amplifier without affecting the layout areas. Consequently, the data swap circuit can be arranged with the increase in chip size being minimized.

In a preferred example in one aspect of the present embodiment, the bit lines are wired using a first metal wiring layer. The contact is coupled to a wiring wired using a second metal wiring layer located higher than the first metal wiring layer. In the layout areas of the access control circuits, as described above, circuit blocks are arranged repeatedly, and transistors, wirings, and so on are arranged in high density. Particularly, two bit lines are wired in each of the access control circuits, and thus wiring density thereof is high and distances between wirings are short. Accordingly, when wiring shapes of the bit lines vary due to fluctuation of manufacturing conditions of the semiconductor memory, a leak failure is liable to occur between the bit lines and the contact. In the present embodiment, this kind of leak failure can be detected efficiently, and test efficiency can be improved.

In a preferred example in one aspect of the present embodiment, a compression control circuit operates during a test mode and generates a write data signal having a plurality of bits based on a data signal supplied to at least one of the data terminals. Here, the compression control circuit outputs a swap signal depending on a write data signal to be generated and an address signal for selecting the bit line pairs and the access control circuits. The data swap circuit prohibits or permits swapping of the connections depending on the swap signal. In the present embodiment, in the semiconductor memory having a data compression function, test efficiency can be improved, and test costs can be reduced.

In the present embodiment, data with logics inverse to each other can be easily written in a pair of access control circuits corresponding to a same data terminal and arranged adjacent to each other, and test efficiency can be improved.

Hereinafter, embodiments of the present embodiment will be described with reference to the drawings. Double circles in the drawings represent external terminals. In the drawings, each thick line represents a signal line that consists of a plurality of lines. Some of the blocks connected with the thick lines consist of a plurality of circuits each. Signals supplied through the external terminals are designated by the same reference symbols as the names of the terminals. Signal lines for transmitting signals are designated by the same reference symbols as the names of the signals. Signals ending in "Z" are of positive logic. Signals heading in "/" and signals ending in "X" are of negative logic.

Figure 4:
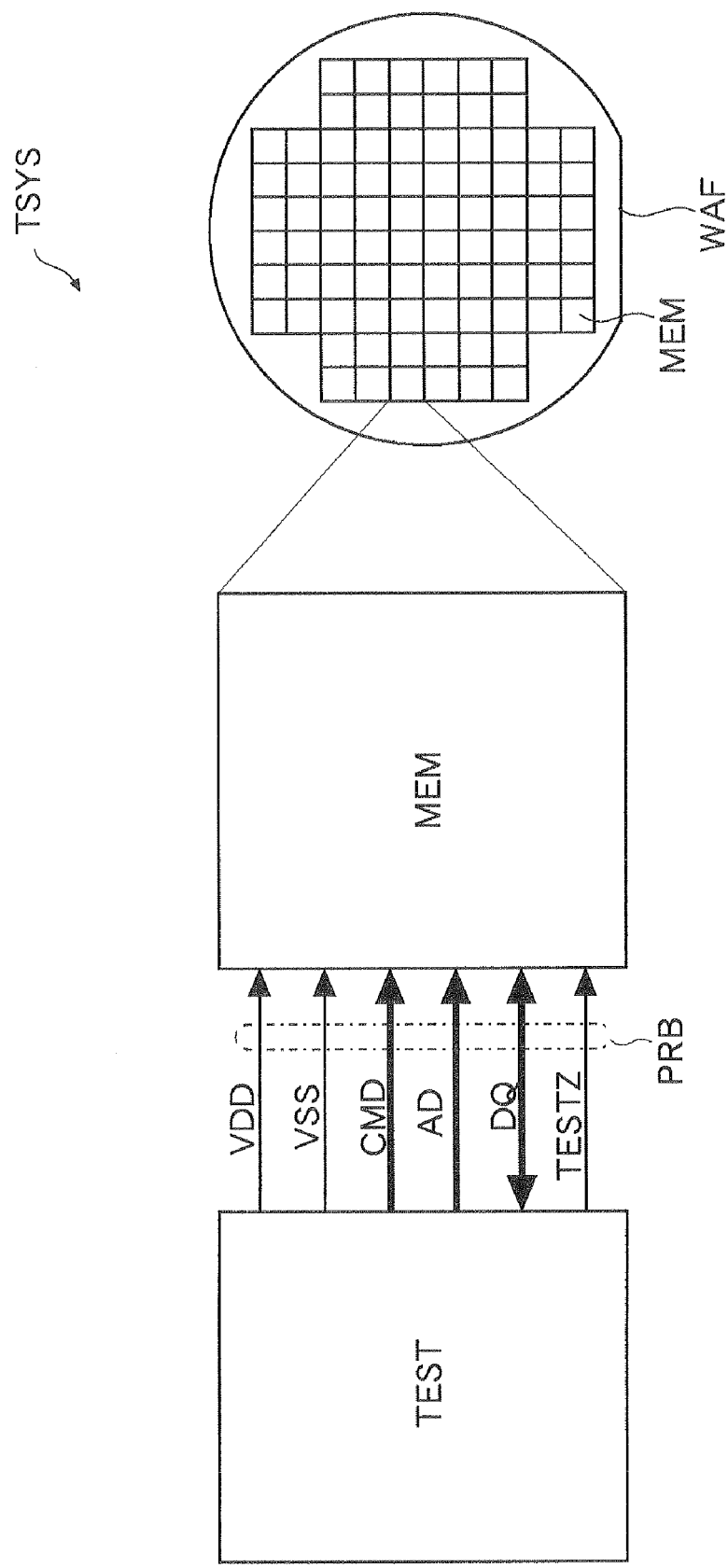
FIG. 4 is a block diagram illustrating an example of a system in which the semiconductor memory in FIG. 2 is mounted.
Figure 5:
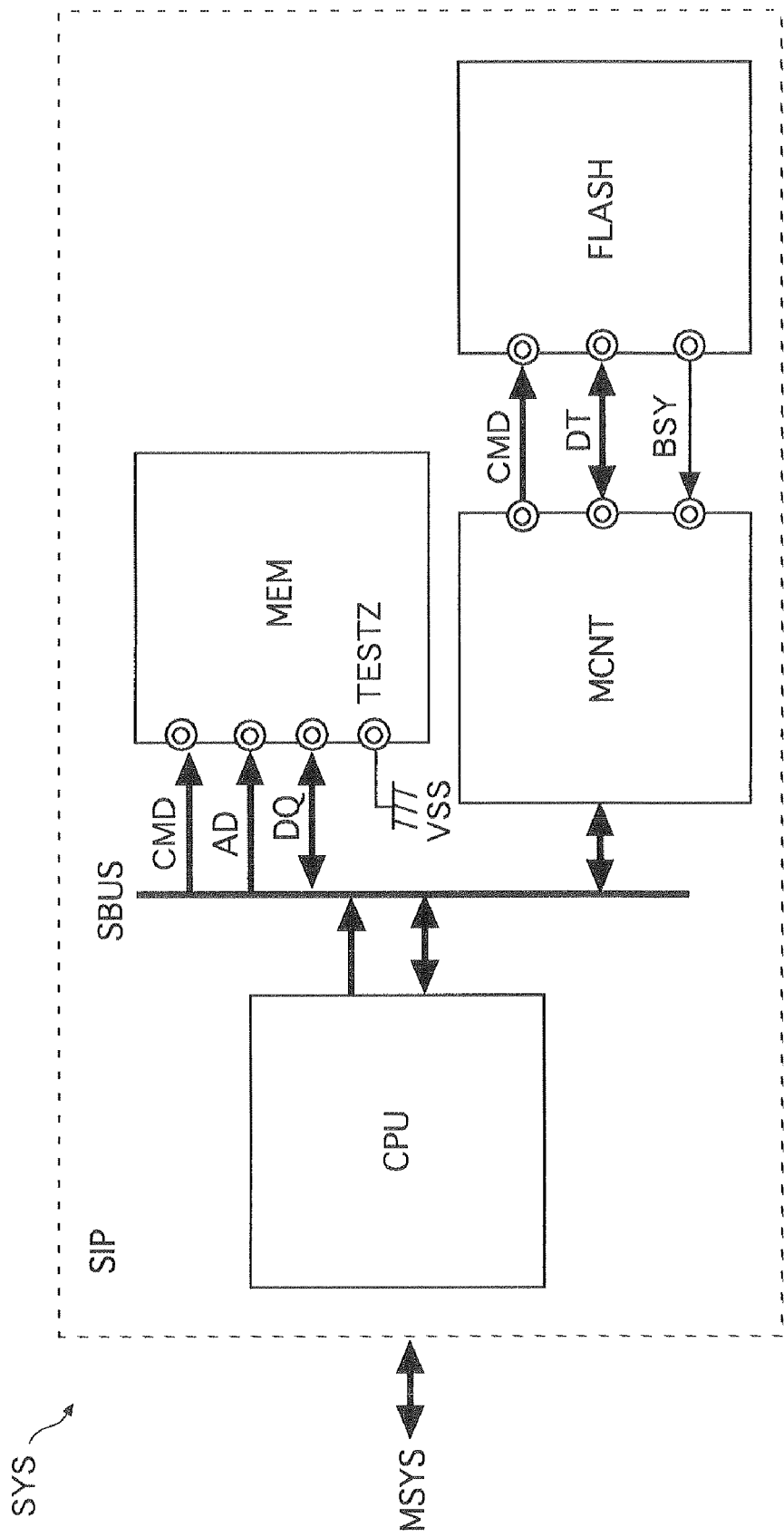
FIG. 5 is a block diagram illustrating another example of a system in which the semiconductor memory in FIG. 2 is mounted.

FIG. 1 illustrates a substantial part of a semiconductor memory in a first embodiment of the present embodiment. The semiconductor memory MEM has a memory cell array ARY, a sense amplifier area SAA, a data swap circuit DSW and data input/output buffers DIO. Note that FIG. 1 illustrates a minimum structure for realizing the present embodiment. The memory cell array ARY has a plurality of memory cells MC, a plurality of complementary bit line pairs BL, /BL coupled to memory cells MC lined up in a vertical direction (first direction) in the diagram, and word lines WL coupled to memory cells MC lined up in a horizontal direction (second direction) in the diagram. The semiconductor memory MEM forms a system TSYS (or SYS) together with a controller TEST (or CPU) as illustrated in FIG. 4 and FIG. 5.

The sense amplifier area SAA has sense amplifiers SA each coupled to one of the bit line pairs BL, /BL, column switches CSW each coupled to one of the bit lines BL, /BL, and contacts Ca, Cb, Cc for coupling nodes in the sense amplifiers SA and the column switches CSW to a voltage line or a signal line. The sense amplifiers SA and the column switches CSW function as an access control circuit which operates when the memory cells MC are accessed. Portions of the bit lines BL, /BL are wired in the sense amplifiers SA and the column switches CSW. The contacts Ca, Cb, Cc are arranged between access control circuits (SA and CSW, or the like) adjacent to each other. For example, the contact Ca is a voltage line to which a voltage (for example, a power supply voltage) higher than the low level voltage in the bit lines BL, /BL is supplied, the contact Cb is a voltage line to which a voltage (for example, a precharge voltage of a bit line) lower than the high level voltage in the bit lines BL, /BL is supplied, and the contact Cc is a control signal line in which a voltage changes during an access operation.

For example, the bit line pairs BL, /BL correspond respectively to data terminals DQ (Da, Da, Db, Db) and address signals AD (Aa, Ab, Ab, Aa) in order from the left side in the diagram. Thus, in this embodiment, the bit line pairs BL, /BL corresponding to the respective data terminals DQ are arranged in different areas from each other. That is, the memory MEM has a memory cell array sectioned by every data terminal DQ. For example, two bit line pairs BL, /BL and a pair of access control circuits on the left side in the diagram are assigned the same data terminal Da and assigned different addresses Aa, Ab. Similarly, two bit line pairs BL, /BL and a pair of access control circuits on the right side in the diagram are assigned the same data terminal Db and assigned different addresses Aa, Ab.

During a normal operation mode NRML in which a test control signal TESTZ is inactivated, the data swap circuit DSW couples internal data buses IDQ corresponding to a data terminal DQ to data buses DB (data lines) corresponding to the same data terminal DQ. The data buses DB are coupled in common to the access control circuits and the bit line pairs BL, /BL corresponding to the data terminal DQ. During a test mode TST in which the test control signal TESTZ is activated, the data swap circuit DSW couples internal data buses IDQ corresponding to a data terminal DQ (for example, Da) to data buses DB corresponding to the same data terminal DQ (for example, Da) or data buses DB corresponding to a different data terminal DQ (for example, Db), depending on the value of the address signal AD for selecting a bit line pair and access control circuits.

For example, during the test mode TST, the data swap circuit DSW does not swap connections between the internal data buses IDQ and the data buses DB when the value of the address signal AD is Aa, and swaps the connections between the internal data buses IDQ and the data buses DB when the value of the address signal AD is Ab. That is, the data swap circuit DSW has a function to swap the connections between a pair of data terminals DQ and pairs of data buses DB corresponding to these data terminals DQ with each other. When the memory cells MC corresponding to one of the pair of access control circuits are accessed, swapping of connections by the data swap circuit DSW is prohibited, and when the memory cells MC corresponding to the other of the pair of access control circuits are accessed, swapping of connections is carried out by the data swap circuit DSW.

The data input/output buffers DIO each receive a write data signal via the data terminal DQ, and output the received data signal to the internal data buses IDQ. Further, the data input/output buffers DIO each receive a read data signal from the memory cells MC via the internal data buses IDQ, and output the received data signal to the data terminal DQ.

Figure 2:
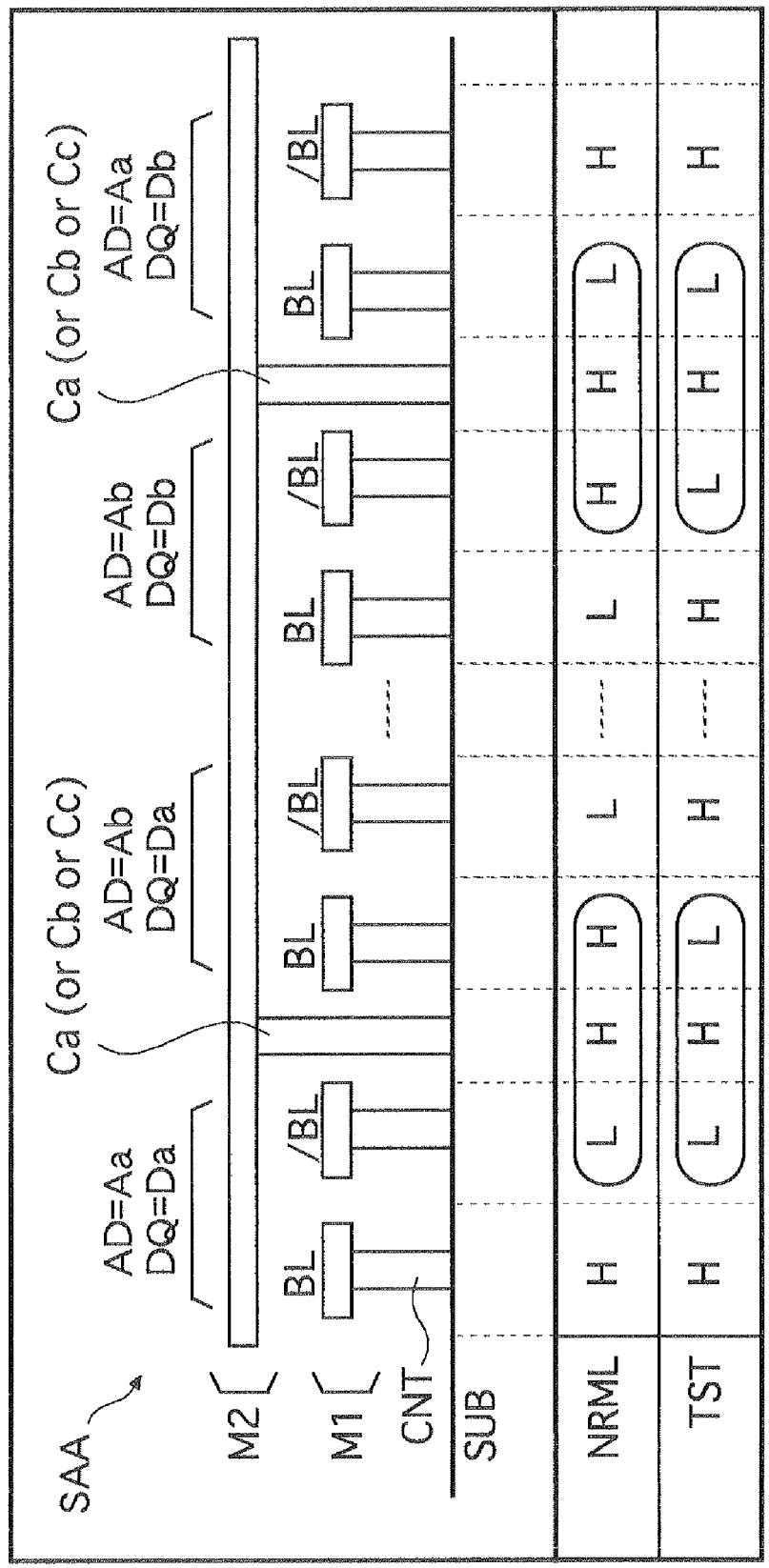
FIG. 2 is an explanatory diagram illustrating an overview of wirings of a sense amplifier area illustrated in FIG. 1 and voltage levels given to the wirings.

FIG. 2 illustrates an overview of wirings of the sense amplifier area SAA illustrated in FIG. 1, and voltage levels given to the wirings. The bit lines BL, /BL are wired using a first metal wiring layer M1. The bit lines BL, /BL are coupled to a semiconductor substrate SUB (diffusion layer) of the sense amplifier area SAA via contacts CNT. A wiring coupled to the contacts Ca, Cb or Cc is wired using a second metal wiring layer M2 located higher than the first metal wiring layer M1. The description below will be given assuming that, for example, a high level voltage H (for example, a power supply voltage) is supplied to the contact Ca.

In the sense amplifier area SAA, basic circuit blocks are arranged repeatedly, and transistors, wirings, and so on are arranged in high density. Particularly, since the bit line pair BL, /BL is wired in each of the access control circuits of the sense amplifier area SAA, the wiring density is high and distances between the wirings are short. Accordingly, when the wiring shapes of the bit lines BL, /BL vary due to fluctuation of manufacturing conditions of the memory MEM, a leak failure is liable to occur between the bit line BL (or /BL) and the contact Ca (or Cb, Cc). In the present embodiment, as will be described below, this kind of leak failure can be detected efficiently, and test efficiency can be improved.

For example, in the normal operation mode NRML, the address signals Aa, Ab are supplied sequentially to the memory MEM together with a write command, and a high logic level H and a low logic level L are supplied to the data terminals Da, Db respectively. During the normal operation mode NRML, the data swap circuit DSW prohibits swapping of connections. Accordingly, write data H supplied to the data terminal Da is written in the memory cells MC via the bit line pair BL, /BL corresponding to the data terminal Da. Write data L supplied to the data terminal Db is written to the memory cells MC via the bit line pair BL, /BL corresponding to the data terminal Db. While the sense amplifiers SA are activated, the bit lines BL, /BL corresponding to the data terminal Da are held at H level (for example, power supply voltage) and L level (for example, ground voltage), respectively. The bit lines BL, /BL corresponding to the data terminal Db are held at L level and H level, respectively.

Here, in the sense amplifier area SAA corresponding to the data terminal Da, the bit lines /BL, BL on both sides of the contact Ca are held at L level and H level, respectively. In the sense amplifier area SAA corresponding to the data terminal Db, the bit lines /BL, BL on both sides of the contact Ca are held at H level and L level, respectively. Accordingly, when performing a stress test such as burn-in test in the normal operation mode NRML, stress occurs between one of the bit lines BL, /BL and the contact Ca, but no stress occurs between the other of the bit lines BL, /BL and the contact Ca.

On the other hand, in the test mode TST, the data swap circuit DSW prohibits swapping of the data signal Da and the data signal Db when an address signal Aa is supplied, and swaps the data signal Da and the data signal Db when an address signal Ab is supplied. Accordingly, the bit lines BL, /BL corresponding to the address signal Ab and the data terminal Da are held at L level and H level corresponding to the write data L supplied to the data terminal Db. The bit lines BL, /BL corresponding to the address signal Ab and the data terminal Db are held at H level and L level corresponding to the write data H supplied to the data terminal Da. That is, without changing the logics of data signals supplied to the data terminals Da, Db depending on the address signal AD, data with logics inverse to each other can be easily written in the two sense amplifier areas SAA corresponding to the same data terminal Da (or Db).

Accordingly, when a stress test such as burn-in test is performed in the test mode TST, it is possible to use only one test pattern TP0 (pattern of data signals) to cause stress both between the bit line /BL and the contact Ca and between the bit line BL and the contact Ca. Since it is not necessary to switch the test pattern depending on the address signal AD during the stress test, the test pattern can be designed easily, and test efficiency can be improved.

As above, in the first embodiment, in the semiconductor memory MEM having a pair of access control circuits corresponding to the same data terminal DQ, assigned different addresses AD, and arranged adjacent to each other, it is possible to give data signals at the same logic level to the bit line /BL of one access control circuit and the bit line BL of the other access control circuit without changing the logic of a data signal supplied to the data terminal DQ depending on the address signal AD. Therefore, it is possible to give stress between the contact Ca (or Cb, Cc), which are arranged between the pair of access control circuits, and the bit lines /BL, BL adjacent to this contact Ca (or Cb, Cc) without changing input data of the data signal. Consequently, test efficiency can be improved, and test costs can be reduced.

Figure 3:
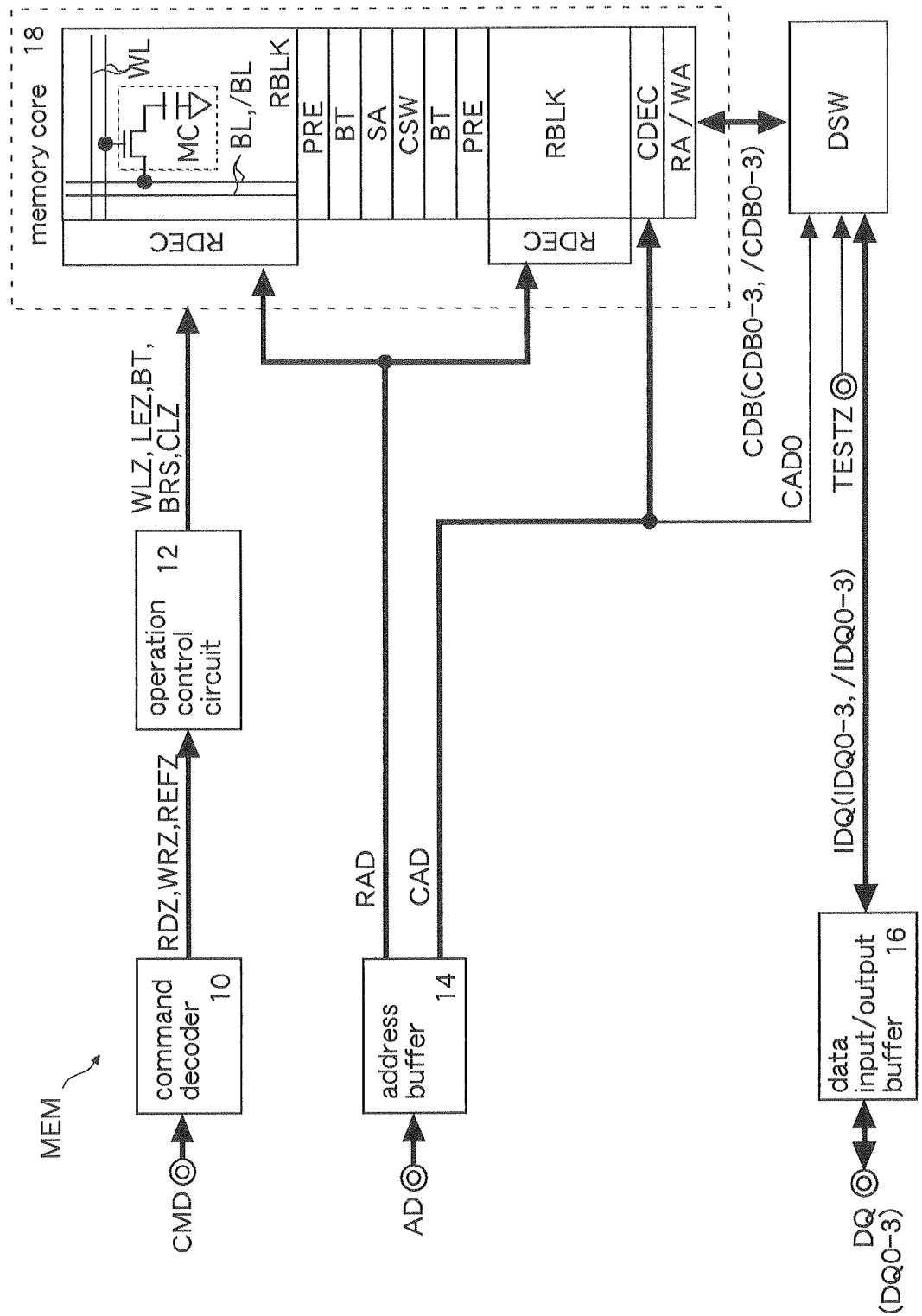
FIG. 3 is a block diagram illustrating a second embodiment of the present embodiment.

FIG. 3 illustrates a second embodiment of the present embodiment. The same elements as those described in the first embodiment are denoted by the same reference numerals or letters, and detailed descriptions thereof are omitted.

The semiconductor memory MEM is, for example, a DRAM. The DRAM may be of either clock synchronous type or clock asynchronous type. The memory MEM has a command decoder 10, an operation control circuit 12, an address buffer 14, a data input/output buffer 16, a memory core 18 and a data swap circuit DSW. Incidentally, the DRAM having a self-refresh mode has a refresh timer and a refresh address generation circuit, and so on for performing a self-refresh operation. The present embodiment is not relevant to self refreshment, and thus descriptions of these circuits are omitted.

The command decoder 10 outputs a command recognized depending on the logic level of a command signal CMD as a read command RDZ, a write command WRZ, and a refresh command REFZ for performing an access operation of the memory core 18. These commands RDZ, WRZ, REFZ are external access requests for performing an access operation to the memory core 18. For example, the command signal CMD is a chip select signal /CS, a write enable signal /WE, a row address strobe signal /RAS, and a column address strobe signal /CAS.

The operation control circuit 12 outputs a word line activation signal WLZ, a sense amplifier activation signal LEZ, a switch control signal BT, a precharge control signal BRS, and a column control signal CLZ for performing a read operation, a write operation, and a refresh operation in the memory core 18 in response to the read command RDZ, the write command WRZ, and the refresh command REFZ. The word line activation signal WLZ is a basic timing signal controlling an activation timing of the word lines WL. The sense amplifier activation signal LEZ is a basic timing signal controlling an activation timing of a sense amplifier SA. The switch control signal BT is a basic timing signal controlling on/off of a connection switch BT which will be described later. The precharge control signal BRS is a basic timing signal controlling on/off of a precharge circuit PRE, which will be described later. The column control signal CLZ is a basic timing signal controlling on/off of a column switch CSW, which will be described later.

The address buffer 14 receives an address signal AD, and outputs the received address signal as a row address signal RAD and a column address signal CAD. The row address signal RAD is supplied for selecting a word line WL. The column address signal CAD is supplied for selecting bit lines BL, /BL and a sense amplifier SA, and so on. In this embodiment, the row address signal RAD and the column address signal CAD are supplied at different timings from each other to a common address terminal AD (address multiplex system). Specifically, the row address signal RAD is supplied to the address terminal AD in synchronization with the row address strobe signal /RAS. The column address signal CAD is supplied to the address terminal AD in synchronization with the column address strobe signal /CAS.

The data input/output buffer 16 receives a write data signal via the data terminal DQ, and outputs the received data signal to the internal data buses IDQ and a common data bus CDB. Further, the data input/output buffer 16 receives a read data signal from the memory cells MC via the common data bus CDB and the internal data buses IDQ, and outputs the received data signal to the data terminal DQ. Incidentally, in this embodiment, for simplicity of description, the number of bits of the data terminal DQ is 4 (DQ0-DQ3). However, in an actual device, the number of bits of the data terminal DQ is 8, 16, 32, or the like. For example, when the data terminal DQ is of 8 bits, descriptions of DQ0-3, IDQ0-3, and so on given below will be replaced with DQ0-3 (or DQ4-7), IDQ0-3 (or IDQ4-7).

The function of the data swap circuit DSW is the same as that of the data swap circuit DSW in the first embodiment. During the normal operation mode (test control signal TESTZ=low logic level), the data swap circuit DSW outputs complementary internal data signals IDQ0-3, /IDQ0-3 corresponding to data signals received at data terminals DQ0-3 to common data buses CDB0-3, /CDB0-3 (data lines). Further, during the test mode (test control signal TESTZ=high logic level), the data swap circuit DSW swaps the complementary internal data signals IDQ0-3, /IDQ0-3 corresponding to data signals received at the data terminals DQ-3 depending on the logic of the column address signal CAD0, and outputs the swapped signals to the common data buses CDB0-3, /CDB0-3. Details of operation of the data swap circuit DSW will be described with FIG. 10 and FIG. 11.

The data swap circuit DSW is arranged between a write amplifier WA/a read amplifier RA and the data input/output buffer 16 on the outside of the memory core 18. Generally, in layout areas of the memory core 18, basic circuit blocks are arranged repeatedly, and transistors, wirings and so on are arranged in high density. Accordingly, when the data swap circuit DSW is inserted in these layout areas, a large layout change is needed. On the other hand, the outside area of the memory core 18 often has a room for inserting a circuit. Thus, the data swap circuit DSW can be arranged with the increase in chip size being minimized, without affecting the layout areas of the memory core 18.

The memory core 18 has a row decoder RDEC, a column decoder CDEC, a precharge circuit PRE (precharge switch), a connection switch BT, a sense amplifier SA, a column switch CSW, a read amplifier RA, a write amplifier WA and a plurality of memory blocks RBLK. Although not illustrated, for example, four memory blocks RBLK are formed. Each memory block RBLK has a plurality of memory cells MC arranged in a matrix form, bit lines BL, /BL coupled to memory cells MC lined up in a first direction, and word lines WL coupled to memory cells MC lined up in a second direction orthogonal to the first direction. The memory cells MC each have a capacitor for holding data as a charge, and a transfer transistor for coupling one end of the capacitor to the bit line BL (or /BL). The other end of the capacitor is coupled to a precharge voltage line VPR. Incidentally, the other end of the capacitor may be coupled to a cell-plate voltage line VCP (not illustrated), instead of the precharge voltage line VPR. A gate of the transfer transistor is coupled to the word line WL. By selecting the word line WL, one of read operation, write operation, and refresh operation is performed.

The row address decoder RDEC decodes the internal row address signal RAD for selecting one of the word lines WL. The column address decoder CDEC decodes the column address signal CAD for selecting a number of bit line pairs BL, /BL corresponding to the number of bits (4 in this example) of the data terminal DQ. The sense amplifier SA amplifies the difference between signal amounts of data signals read to the bit line pair BL, /BL. The column switch CSW couples the bit lines BL, /BL corresponding to the column address signal CAD to the read amplifier RA and the write amplifier WA. The read amplifier RA amplifies complementary read data to be output via the column switch CSW in a read access operation. The write amplifier WA amplifies complementary write data supplied via the common data bus CDB and supplies the amplified data to the bit line pair BL, /BL in a write access operation. Note that in the following description the precharge circuit PRE, the connection switch BT, the sense amplifier SA and the column switch CSW sandwiched by a pair of memory blocks RBLK will be referred to as an access control circuit. The area where the access control circuit is arranged will be referred to as a sense amplifier area SAA.

FIG. 4 illustrates an example of a system in which the semiconductor memory MEM illustrated in FIG. 3 is mounted. In this example, a test system TSYS testing the memory MEM formed on a wafer WAF is illustrated. The test system TSYS is made up of an LSI tester TEST (controller) which accesses the memory MEM, and memories MEM in a wafer state WAF mounted on a not-illustrated prober or the like of the LSI tester TEST.

In the test system TSYS, the memory MEM is tested by the LSI tester TEST before being cut out from the wafer WAF. The LSI tester TEST supplies an external power supply voltage VDD and a ground voltage VSS to the memory MEM, together with the command signal CMD and the test control signal TESTZ. The memory MEM is coupled to, for example, the LSI tester TEST via a probe PRB of a not-illustrated probe card. Although one memory MEM is coupled to the LSI tester TEST in the diagram, a plurality (four for example) of memories MEM may be coupled simultaneously to the LSI tester TEST. The number of memories MEM to be coupled to the LSI tester TEST at once depends on the number of terminals of the LSI tester TEST and the number of terminals of the memory MEM. In this embodiment, the LSI tester TEST activates the test control signal TESTZ to a high logic level when a stress test (FIG. 11 and FIG. 12) which will be described later is carried out. The memory MEM enters the test mode in response to activation of the test control signal TESTZ, and exits the test mode in response to inactivation of the test control signal TESTZ.

FIG. 5 illustrates another example of a system in which the semiconductor memory MEM illustrated in FIG. 3 is mounted. This system SYS forms a part of a product on which the memory MEM is mounted. That is, the memory MEM illustrated in FIG. 5 is a chip judged as a good product by the test system TSYS in FIG. 4. The system SYS is formed as, for example, a system in package SIP (System In Package) integrated on a silicon substrate. The SIP has the memory MEM illustrated in FIG. 3, a flash memory FLASH, a memory controller MCNT accessing the flash memory FLASH, and a CPU (controller) controlling the entire system. The CPU, the memory MEM and the memory controller MCNT is coupled to each other by a system bus SBUS. The SIP is coupled to a higher main system MSYS via an external bus. The CPU outputs the command signal CMD, the address signal AD and the write data signal DQ for accessing the memory MEM, and receives the read data signal DQ from the memory MEM. The test control signal terminal TESTZ is grounded on the SIP. That is, the test control signal TESTZ is always inactivated, and the swap circuit DSW does not perform switching (swap operation) of connections.

Figure 6:
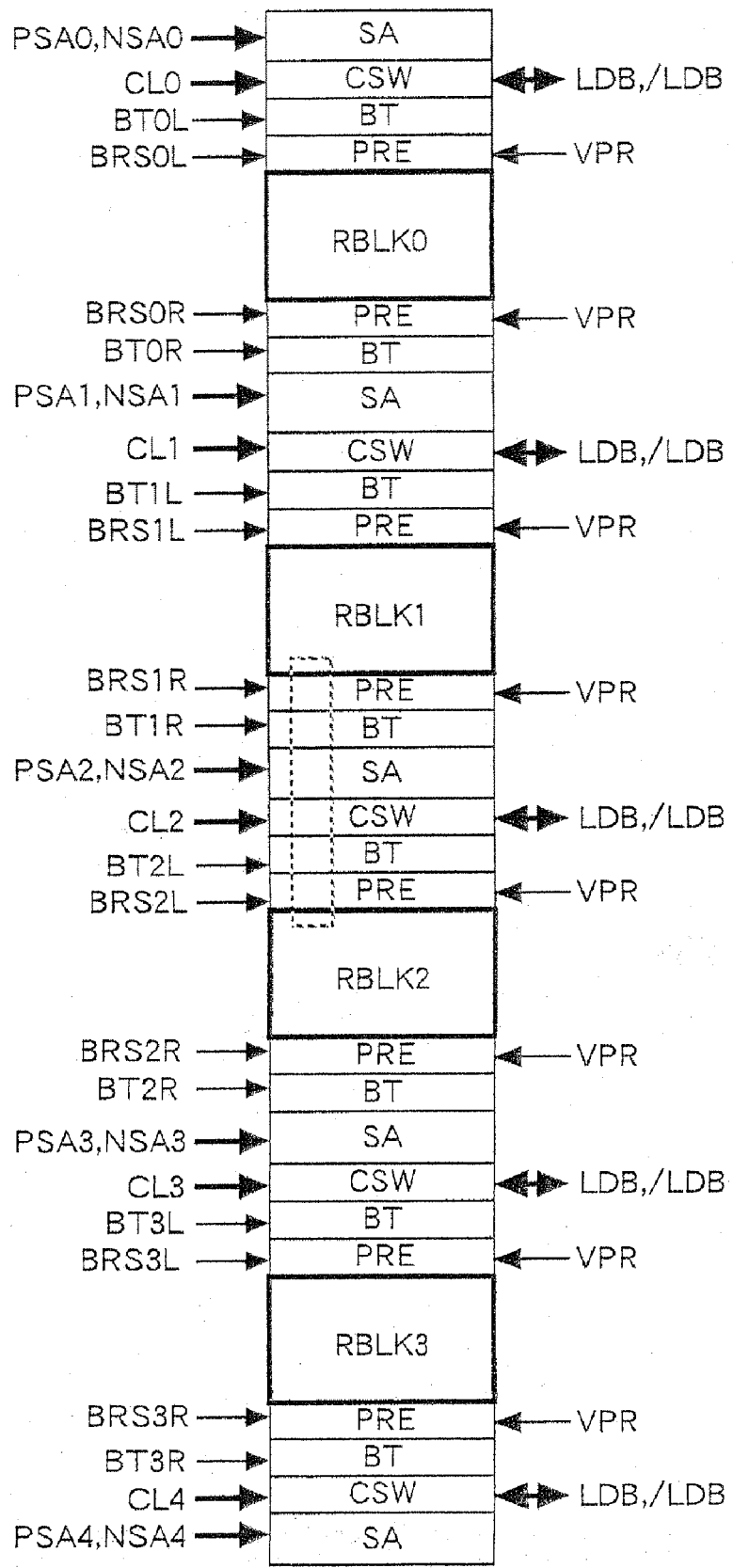
FIG. 6 is a block diagram illustrating an overview of a memory core illustrated in FIG. 2.

FIG. 6 illustrates an overview of the memory core 18 illustrated in FIG. 3. The precharge circuit PRE, the connection switch BT, the column switch CSW and the sense amplifier SA are arranged on both sides of each of the memory blocks RBLK0-3. That is, the sense amplifier SA arranged between a pair of memory blocks RBLK adjacent to each other (for example, RBLK0-1) is shared by the pair of memory blocks RBLK (shared sense amplifier system).

Each sense amplifier SA operates in synchronization with sense amplifier activation signals PSA, NSA (PSA0-4, NSA0-4). The sense amplifier activation signals PSA. NSA are signals synchronized with the sense amplifier activation signal LEZ illustrated in FIG. 3. Signal lines of the sense amplifier activation signals PSA, NSA are wired for each block of the sense amplifier SA. Each column switch CSW couples complementary outputs of the sense amplifier SA to local data buses LDB, /LDB in synchronization with a column switch signal CL (CL0-CL4). A signal line of the column switch signal CL is wired for each group of the column switches CSW corresponding to the number of bits of the data terminal DQ.

Each connection switch BT operates in synchronization with a switch control signal BT (BT0L-BT3L, BT0R-BT3R). A signal line of the switch control signal BT is wired for each block of the connection switch BT. Each precharge circuit PRE couples the bit lines BL, /BL to the precharge voltage line VPR in synchronization with a precharge control signal BRS (BRS0L-BRS3L, BRS0R-BRS3R). The signal line of the precharge control signal BRS is wired for each block of the precharge circuit PRE.

Figure 7:
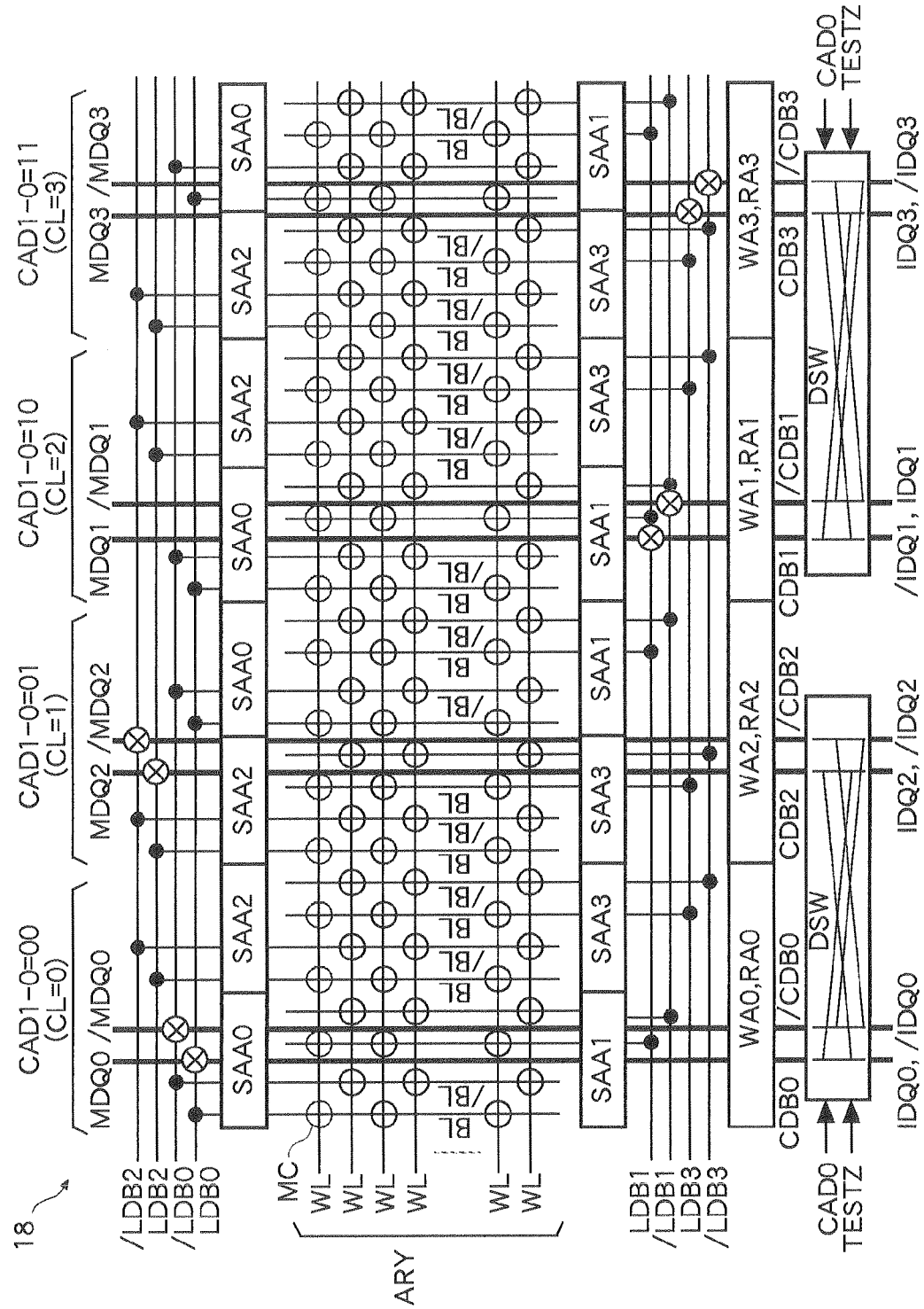
FIG. 7 is a block diagram illustrating a substantial part of the memory core illustrated in FIG. 2.

FIG. 7 illustrates a substantial part of the memory core 18 illustrated in FIG. 3. The numbers shown in sense amplifier areas SAA (SAA0-3) indicate the numbers of the corresponding data terminals DQ. Bit line pairs BL, /BL are coupled to complementary local data buses LDB, /LDB (LDB0-3, /LDB0-3) via the sense amplifier areas SAA. The local data buses LDB, /LDB are coupled to complementary main data buses MDQ, /MDQ (MDQ0-3, /MDQ0-3) via switches (circles with X in the diagram). The switches turn on depending on the address signal AD for selecting a memory block RBLK. The main data bus MDQ is then coupled to the local data buses LDB, /LDB corresponding to the accessed memory block RBLK (one of RBLK0-3).

The main data buses MDQ, /MDQ are coupled to complementary common data buses CDB, /CDB (CDB0-3, /CDB0-3) via the write amplifier WA and the read amplifier RA. As illustrated in FIG. 3, the common data buses CDB, /COB are then coupled to complementary internal data buses IDQ, /IDQ (IDQ0-3, /IDQ0-3; data lines) via the data swap circuit DSW. Incidentally, the data buses are made up of complementary data lines, but may be made up of single data lines.

In this example, for each of column address signals CAD (for example, CAD1-0), the sense amplifier areas SAA0, SAA2 corresponding to the data terminals DQ0, DQ2 and the sense amplifier areas SAA1, SAA3 corresponding to the data terminals DQ1. DQ3 are arranged on both sides (top and bottom in the diagram) of the memory cell array ARY. In the area corresponding to an even-numbered column address signal CAD (CAD0=0), the sense amplifier areas SAA0, SAA2 and the sense amplifier areas SAA1, SAA3 are arranged from the left side of the diagram. In the area corresponding to an odd-numbered column address signal CAD (CAD0=1), the sense amplifier areas SAA0, SAA2 and the sense amplifier areas SAA1, SAA3 are arranged from the right side of the diagram. Thus, the sense amplifier areas SAA0-3 corresponding to an even-numbered column address signal CAD (CAD0=0) and the sense amplifier areas SAA0-3 corresponding to an odd-numbered column address signal CAD (CAD0=1) are laid out in a mirror symmetry with each other. In the memory cell array ARY, the bit lines BL, /BL extend in a vertical direction (first direction) in the diagram and are arranged alternately in a horizontal direction (second direction) in the diagram. CL0-3 in the diagram denote column switch signals for turning on the column switches CSW. The column switch signals CL0-3 are generated depending on the values of the column address signals CAD0-1.

The data swap circuit DSW couples the internal data buses IDQ0-3, /IDQ0-3 to the common data buses CDB0-3, /CDB0-3 during the normal operation mode in which the test control signal TESTZ is inactivated. The data swap circuit DSW couples the internal data buses IDQ0-3, /IDQ0-3 to the common data buses CDB0-3, /CDB0-3 when the column address signal CAD0 is 0 (even number) during the test mode in which the test control signal TESTZ is activated (swapping of connections is prohibited). The data swap circuit DSW couples the internal data buses IDQ0, IDQ1, IDQ2, IDQ3, /IDQ0, /IDQ1, /IDQ2, /IDQ3 to the common data buses CDB2, CDB3, CDB0, CDB1, /CDB2, /CDB3, /CDB0, /CDB1 when the column address signal CAD0 is 1 (odd number) during the test mode (swapping of connections; swap operation).

Figure 8:
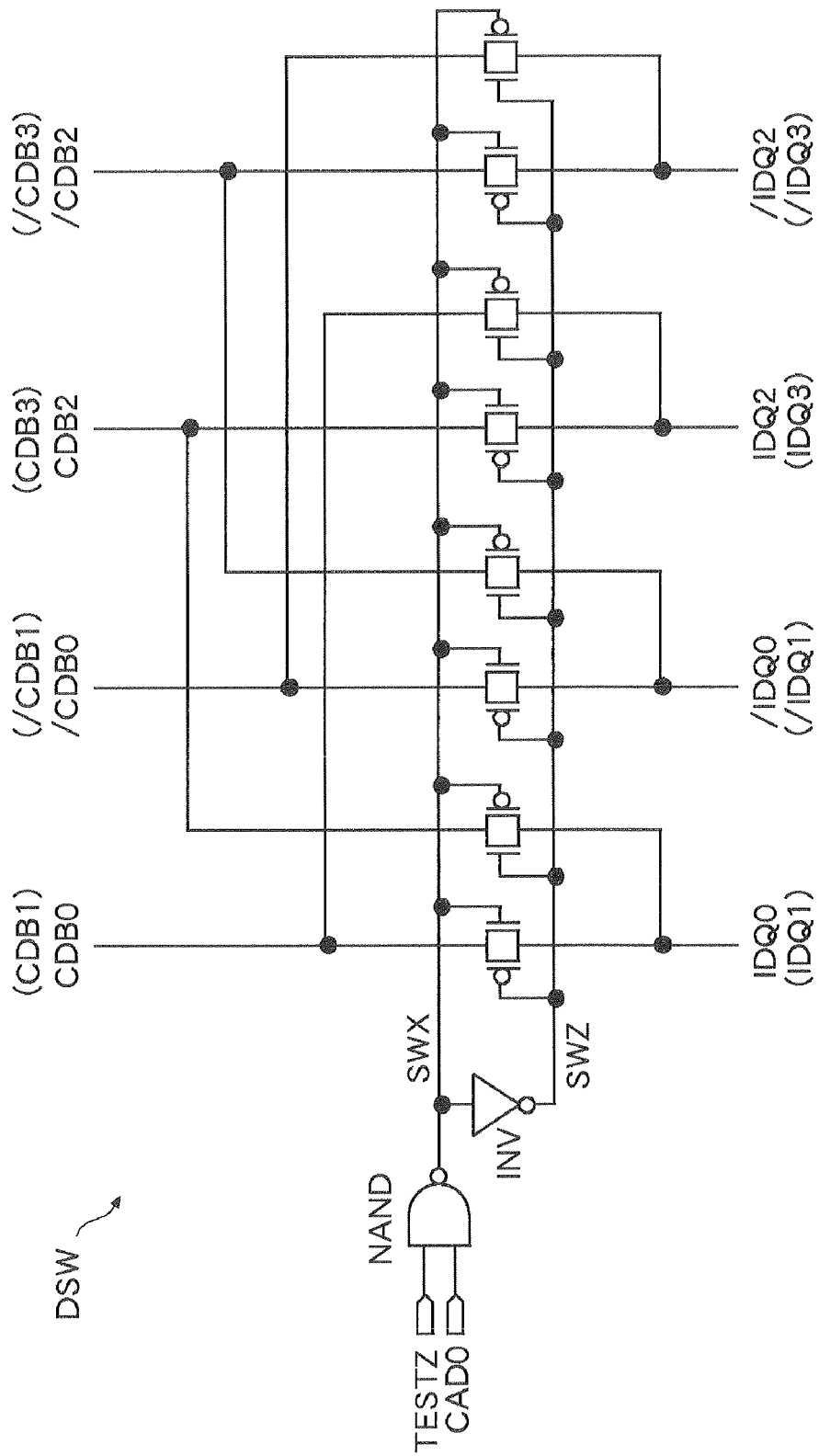
FIG. 8 is a circuit diagram illustrating details of a data swap circuit illustrated in FIG. 7.

FIG. 8 illustrates details of the data swap circuit DSW of the internal data buses IDQ0, IDQ2, /IDQ0, /IDQ2 illustrated in FIG. 7. For the data swap circuit DSW of the internal data buses IDQ1, IDQ3, /IDQ1, /IDQ3, signal names are illustrated in parenthesis in the diagram. The data swap circuit DSW has a NAND gate, an inverter INV, and eight CMOS transmission gates arranged between the common data buses CDB0-3 and the internal data buses IDQ0-3. The NAND gate activates a switch signal SWX to low logic level when the test control signal TESTZ at high logic level and the column address signal CAD0 at high logic level (by which an odd-numbered CL is selected) are received. The inverter INV inverts the logic level of a switch signal SWZ. Then, while the switch signal SWX is activated, the transmission paths of data signals cross each other, to thereby perform the above-described swap operation.

Figure 9:
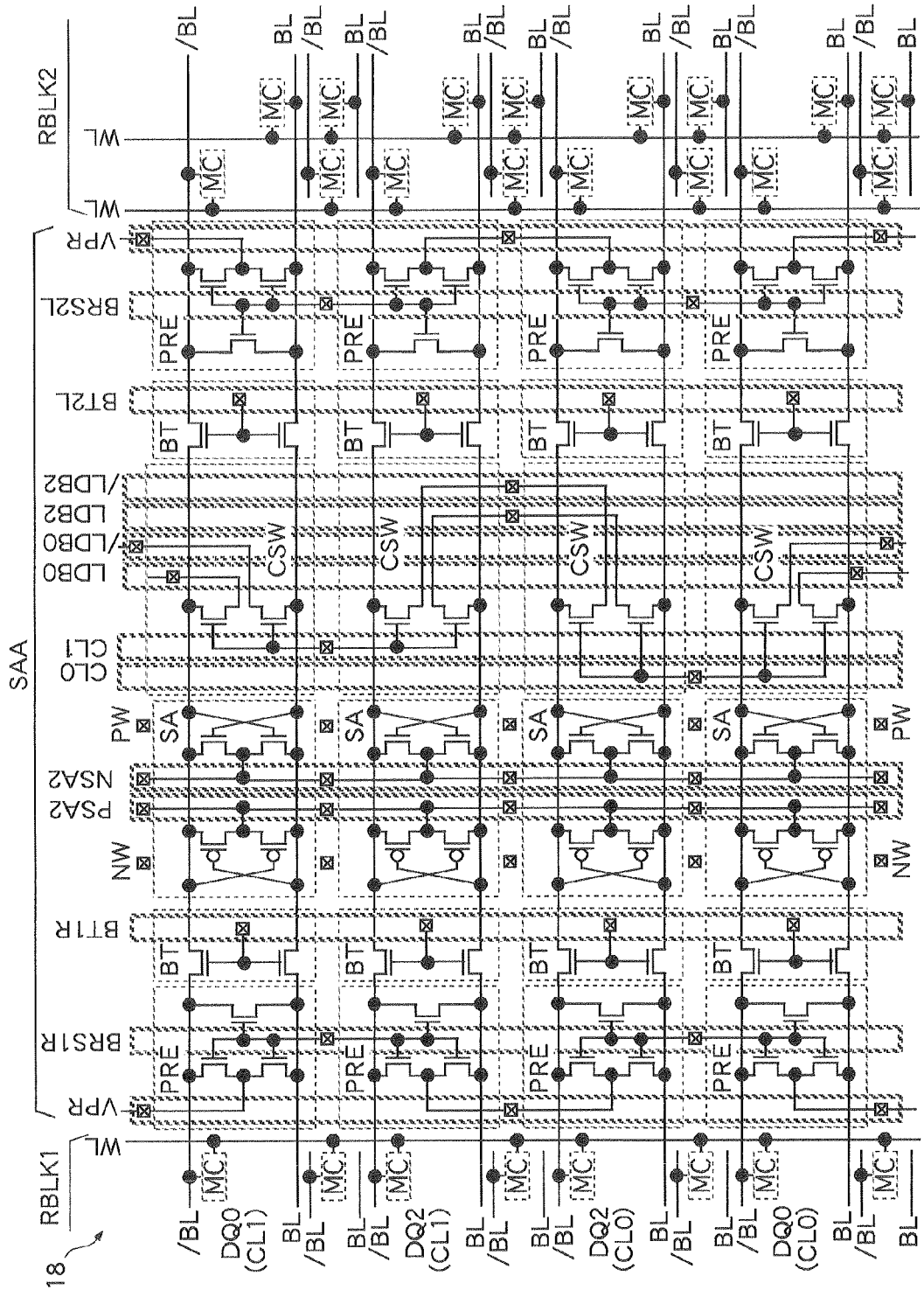
FIG. 9 is a circuit diagram illustrating details of an area denoted by a dashed line frame in FIG. 6.

FIG. 9 illustrates details of an area (areas corresponding to DQ0,2) denoted by a dashed line frame in FIG. 6. Note that in FIG. 9, bit lines of the sense amplifier area SAA coupled to the bit lines BL, /BL via the coupling switches BT are also referred to as bit lines BL, /BL for convenience. The memory cells MC coupled to the word lines WL are coupled to one of the bit lines BL, /BL. Accordingly, for example, when the memory cells MC coupled to the bit line BL are accessed, the bit line /BL functions as a reference voltage line (precharge voltage). The bit lines BL, /BL are formed using the first metal wiring layer M1, similarly to FIG. 2.

Thick dashed line frames extending in the vertical direction in the diagram denote wirings formed using the second metal wiring layer M2 illustrated in FIG. 2. Square marks with X denote contacts (corresponding to Ca, Cb, Cc illustrated in FIG. 2) for coupling wirings of the second metal wiring layer M2 to a semiconductor substrate (diffusion layer), a polysilicon wiring, or the like. For example, contacts of the precharge voltage line VPR are arranged between a pair of precharge circuits PRE which are assigned different address signals (CL0, CL1) from each other and correspond to the same data terminal DQ2. Contacts of the precharge control signal line BRS1R are arranged between precharge circuits PRE having the same address signal (CL0 or CL1) and corresponding to the data terminals DQ0. DQ2 different from each other. Contacts of the sense amplifier activation signal lines PSA2, NSA2, contacts of an N-well region NW in which pMOS transistors of the sense amplifiers SA are formed, and contacts of a P-well region PW in which nMOS transistors of the sense amplifiers SA are formed are arranged on both sides of each sense amplifier SA.

For example, the precharge voltage VPR is always set to a value of one half of an internal power supply voltage VII (½VII). The voltage of the precharge control signal BRS1R is set to a high voltage when the precharge circuits PRE are turned on, and is set to a low voltage when the precharge circuits PRE are turned off. The sense amplifier activation signal line PSA2 is set to VII when the sense amplifiers SA operate, and is set to ½VII when the sense amplifiers SA do not operate. The sense amplifier activation signal NSA is set to VSS when the sense amplifiers SA operate, and is set to ½VII when the sense amplifiers SA do not operate. The N-well region NW is always set to VII, and the P-well region PW is always set to VSS. Incidentally, wirings of the N-well region NW and the P-well region PW (second metal wiring layer M2) are, although not illustrated particularly, formed in the vertical direction in the diagram along the sense amplifier activation signal lines PSA2, NSA2.

Each precharge circuit PRE is made up of a pair of nMOS transistors for coupling the respective complementary bit lines BL, /BL to the precharge voltage line VPR, and an nMOS transistor for coupling the bit lines BL, /BL to each other. Gates of the nMOS transistors of the precharge circuit PRE receive the precharge control signal BRS (BRS1R, BRS2L). The precharge circuit PRE supplies the precharge voltage VPR to the bit lines BL, /BL and equalizes the voltages of the bit lines BL, /BL while receiving the precharge control signal BRS at high logic level.

The connection switches BT are each formed by an nMOS transistor. One of source/drain of the nMOS transistor is coupled to the bit line BL (or /BL), and the other of source/drain of the nMOS transistor is coupled to the sense amplifier SA. A gate of the nMOS transistor receives a switch control signal BT (BT1R, BT2L). The connection switches BT couple the bit lines BL, /BL of the memory block RBLK to the sense amplifiers SA while receiving the switch control signal BT at high logic level.

The sense amplifiers SA are each formed of a pair of CMOS inverters having inputs and outputs coupled to each other. An input of each CMOS inverter (gate of a transistor) is coupled to the bit line BL (or /BL). Each CMOS inverter is made up of an nMOS transistor and a pMOS transistor lined up in the horizontal direction in the diagram. A source of the pMOS transistor of each CMOS inverter receives the sense amplifier activation signal PSA (PSA2). A source of the nMOS transistor of each CMOS inverter receives the sense amplifier activation signal NSA (NSA2).

The column switches CSW are each made up of an nMOS transistor coupling the bit line BL to the local data bus LDB, and an nMOS transistor coupling the bit line /BL to the local data bus /LDB. A gate of each nMOS transistor receives the column switch signal CL (CL0 or CL1). During a read operation, the read data signal on the bit lines BL, /BL amplified by the sense amplifier SA is transmitted to the local data buses LDB, /LDB via the column switch CSW. During a write operation, the write data signal supplied via the local data buses LDB, /LDB is written in the memory cells MC via the bit lines BL, /BL.

Figure 10:
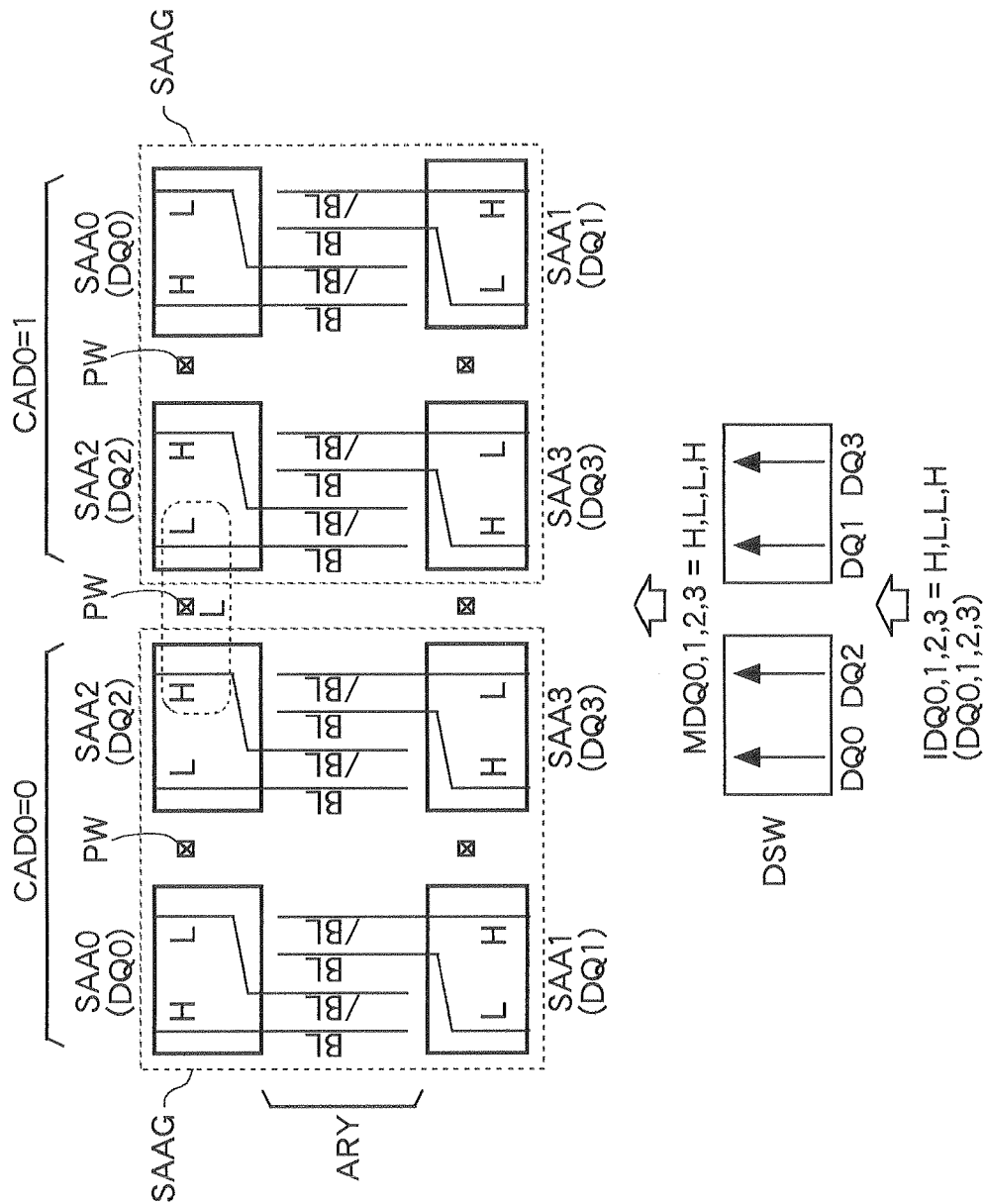
FIG. 10 is an explanatory diagram illustrating a write operation in a normal operation mode in the second embodiment.

FIG. 10 illustrates a write operation in the normal operation mode in the second embodiment.

In this embodiment, for example, pairs of sense amplifier areas (access control circuits) SAA0, SAA2 corresponding to a pair of data terminals DQ0, DQ2 forms a plurality of access control circuit groups SAAG which are assigned different addresses CAD0. In a pair of access control circuit groups SAAG adjacent to each other, the orders of the numbers of the data terminals DQ0, DQ2 assigned to the access control circuits SAA0, SAA2 lined up in the horizontal direction (second direction) in the diagram are reverse to each other. Among four access control circuits SAA0, SAA2 in the pair of access control circuit groups SAAG, the pair of access control circuits SAA2 corresponding to one data terminal DQ2 and assigned different addresses CAD0 are arranged at positions adjacent to each other. For example, a common contact PW supplying a voltage to a common node for the pair of access control circuit groups SAAG is arranged between the pair of access control circuit groups SAAG. The pair of access control circuit groups SAAG adjacent to each other are laid out in a mirror symmetry with each other as described with FIG. 7.

In this example, levels H, L, L, H are supplied to the data terminals DQ0, DQ1, DQ2, DQ3, respectively. In the normal mode, the data swap circuit DSW does not perform the swap operation. Accordingly, the bit lines BL, /BL of the sense amplifier area SAA corresponding to the data terminals DQ0, DQ2 change to levels H, L, L, H, L, H, H, L from the left side in the diagram. The bit lines BL, /BL of the sense amplifier area SAA corresponding to the data terminals DQ1, DQ3 change to levels L, H, H, L, H, L, L, H from the left side in the diagram. With respect to a contact formed between the sense amplifier areas SAA2 adjacent to each other (for example, L (VSS) of the P-well region PW), stress operates between this contact PW and the bit line /BL adjacent thereto. On the other hand, no stress operates between the contact PW and the bit line BL adjacent to this contact PW. To allow stress to operate between the contact PW and the bit line BL, it is necessary to supply levels L, H, H, L to the data terminals DQ0-3 when the column address CAD is 1.

Figure 11:
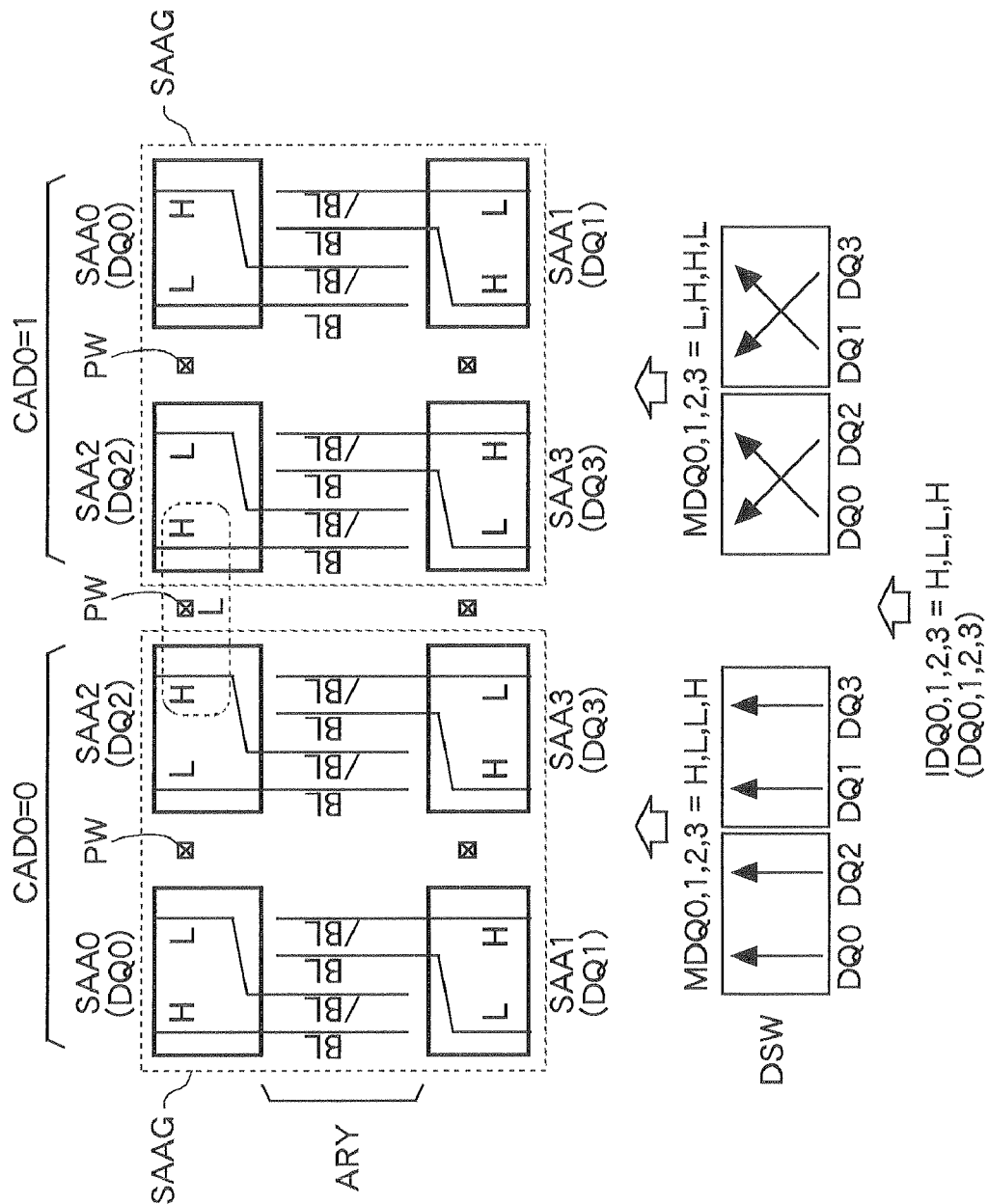
FIG. 11 is an explanatory diagram illustrating a write operation in a test mode in the second embodiment.

FIG. 11 illustrates a write operation in the test mode in the second embodiment. In this example, in a stress test such as a burn-in test, levels H, L, L, H are supplied to the data terminals DQ0, DQ1, DQ2, DQ3 respectively, similarly to FIG. 1. During the test mode, the data swap circuit DSW performs the swap operation when the address signal CAD0=1. Accordingly, the levels of the main data buses MDQ0-3 corresponding to the address signal CAD0=1 are set to L, H, H, L, respectively. Accordingly, the bit lines BL, /BL of the sense amplifier area SAA corresponding to the data terminals DQ0, DQ2 change to levels H, L, L, H, H, L, L, H from the left side in the diagram. The bit lines BL, /BL of the sense amplifier area SAA corresponding to the data terminals DQ1, DQ3 change to levels L, H, H, L, L, H, H, L from the left side in the diagram. Therefore, with respect to a contact formed between the sense amplifier areas SAA2 adjacent to each other (for example, L (VSS) of the P-well region PW), stress operates between this contact PW and the bit lines /BL. BL adjacent to both sides thereof. It is possible to allow stress to operate between the contact PW and the /BL, BL on both sides of this contact PW without changing the test pattern of a data signal, and thus test efficiency can be improved. Further, in a stress test, it is not necessary to switch the pattern of a data signal depending on the address signal AD. Thus, the test pattern can be designed easily, and test efficiency can be improved.

Incidentally, when allowing stress to operate between a contact of the precharge voltage VPR (with voltage of ½VII) and the bit lines /BL, BL adjacent to both sides of this contact, it is just necessary to supply H, L, L, H or L, H, H, L to the data terminals DQ0-3, and set the levels of the bit lines /BL, BL to H levels or L levels. When allowing stress to operate between a contact of the N-well region NW (with voltage of VII) and the bit lines /BL. BL adjacent to both sides of this contact, it is just necessary to supply L, H, H, L to the data terminals DQ0-3 and set the levels of the bit lines /BL, BL to L levels.

Figure 12:
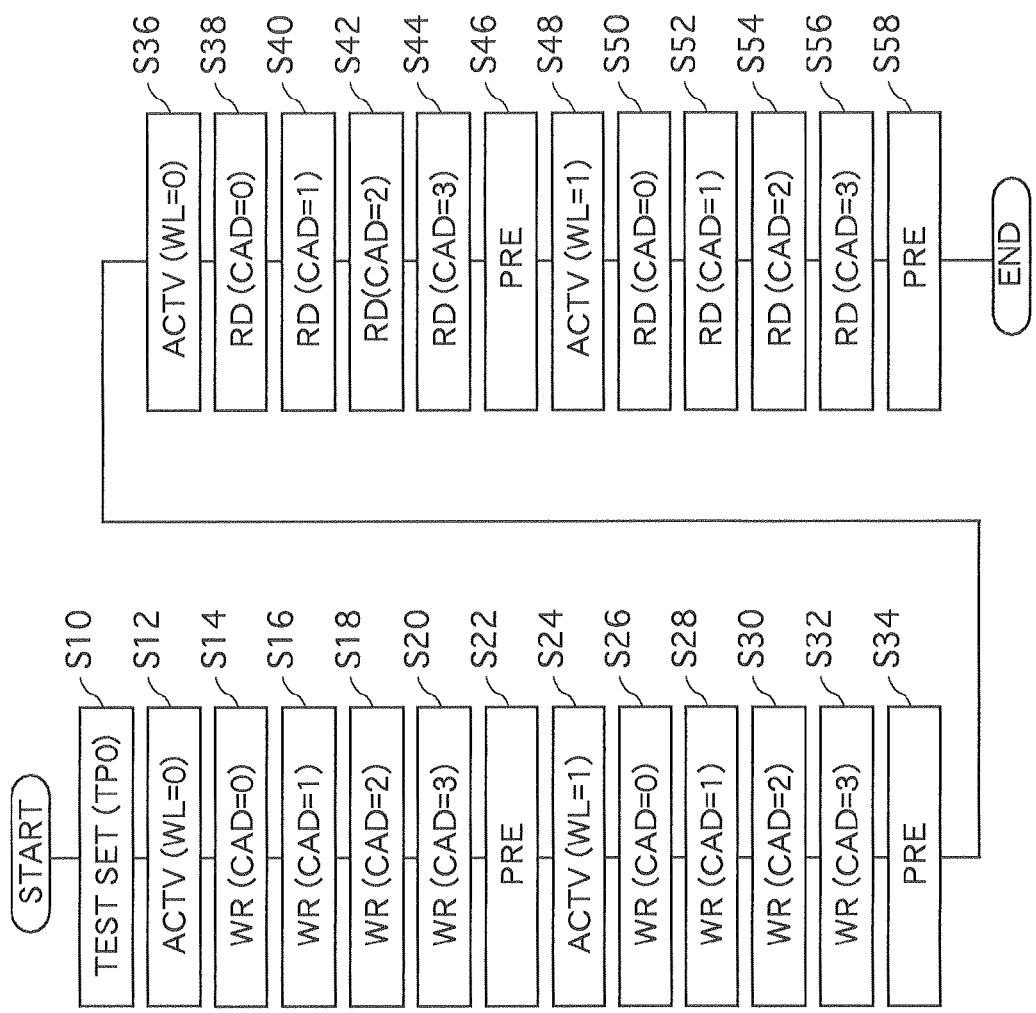
FIG. 12 is a flowchart illustrating an example of a stress test in the second embodiment.

FIG. 12 illustrates an example of a stress test in the second embodiment. The stress test is performed using, for example, the test system TSYS illustrated in FIG. 4. The flow in FIG. 12 indicates a test program executed by the LSI tester TEST in FIG. 4. Hereinafter, for the simplicity of description, there will be explained an example in which the memory MEM has two word lines WL0-1 and has a column address signal CAD of two bits (four values of 0 to 3).

First, in step S10, a test pattern TP0 is set. The test pattern TP0 is, for example, a pattern giving levels H, L, L, H to the data terminals DQ0, DQ1, DQ2, DQ3, respectively, as illustrated in FIG. 11 without depending on the address signal AD. In step S12, the word line WL0 is activated by an active command ACTV and the row address signal RAD supplied to the memory MEM together with the active command ACTV.

In steps S14-S20, a write command WR is supplied to the memory MEM while the column address signal CAD is updated sequentially, and thereby a write operation is performed. Here, in steps S16, S20, the swap operation by the data swap circuit DSW is performed. By the swap operation, the data signal supplied to the data terminal DQ0 for example is written to the memory cells MC corresponding to the data terminal DQ2. In step S22, a precharge command PRE is supplied to the memory MEM. In steps S24-S34, similarly to the steps S12-S22, a write operation of the memory cells MC coupled to the word line WL1 is performed. Here, in steps S28, S32, the swap operation by the data swap circuit DSW is performed.

Next, in step S36, the word line WL0 is activated by the active command ACTV. In steps S38-S44, a read command RD is supplied to the memory MEM while the column address signal CAD is updated sequentially, and data read from the memory cells MC are compared with expected values. In step S46, the precharge command PRE is supplied to the memory MEM. In steps S48-S58, similarly to the steps S36-S46, a read operation to the memory cells MC coupled to the word line WL1 is performed, and read data are compared with expected values. Thus, one test finishes.

In this embodiment, since the memory MEM has the data swap circuit DSW, it is not necessary to switch the pattern (test pattern) of data for every column address signal CAD. Accordingly, the number of steps of the test program can be reduced, and test times can be shortened. Moreover, design times for the test program can be shortened.

Figure 13:
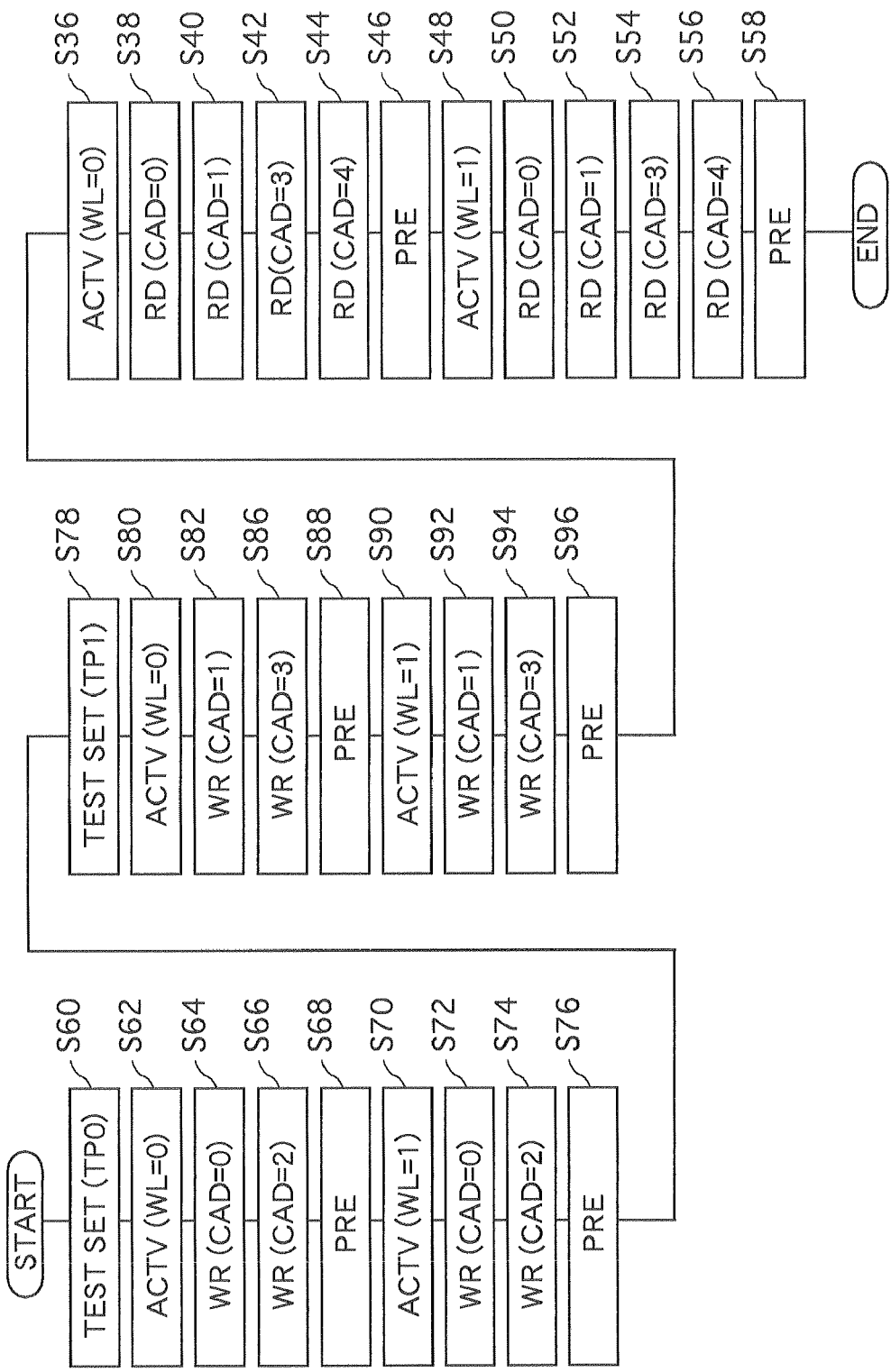
FIG. 13 is a flowchart illustrating an example of a stress test prior to the present embodiment.

FIG. 13 illustrates an example of a stress test prior to the present embodiment. Prior to the present embodiment, as illustrated in FIG. 11, for setting the bit lines BL, /BL of the sense amplifier area SAA corresponding to the data terminals DQ0, DQ2 to levels H, L, L, H, H, L, L, H from the left side of the diagram, it has been necessary to change the test pattern for the write operation of the column address signal CAD0=0 and the write operation for the column address signal CAD0=1. Specifically, it has been necessary to give levels H, L, L, H to the data terminals DQ0-3 in a write operation of the column address signal CAD0=0, and give levels L, H, H, L to the data terminals DQ0-3 in a write operation of the column address signal CAD0=1. Accordingly, when the column address signal CAD is of even number, the write operation is performed with the test pattern TP0, and when the column address signal CAD is of odd number, the write operation is performed with a test pattern TP1. The test pattern TP1 is a pattern giving levels L, H, H. L to the data terminals DQ0-3, respectively. Due to switching of the test patterns, the number of times of the active commands ACTV and the precharge command PRE in the write operation becomes double of that in FIG. 12. The read operation (steps S36-258) is the same as in FIG. 12. Consequently, the number of steps in the test program increases, and test times become long. Furthermore, design times for the test program become long as well.

As above, in the second embodiment, the same effects as those in the first embodiment can be obtained. Furthermore, in this embodiment, in the semiconductor memory MEM having the access control circuit groups SAAG in a mirror symmetry, test efficiency can be improved, and test costs can be reduced.

Figure 14:
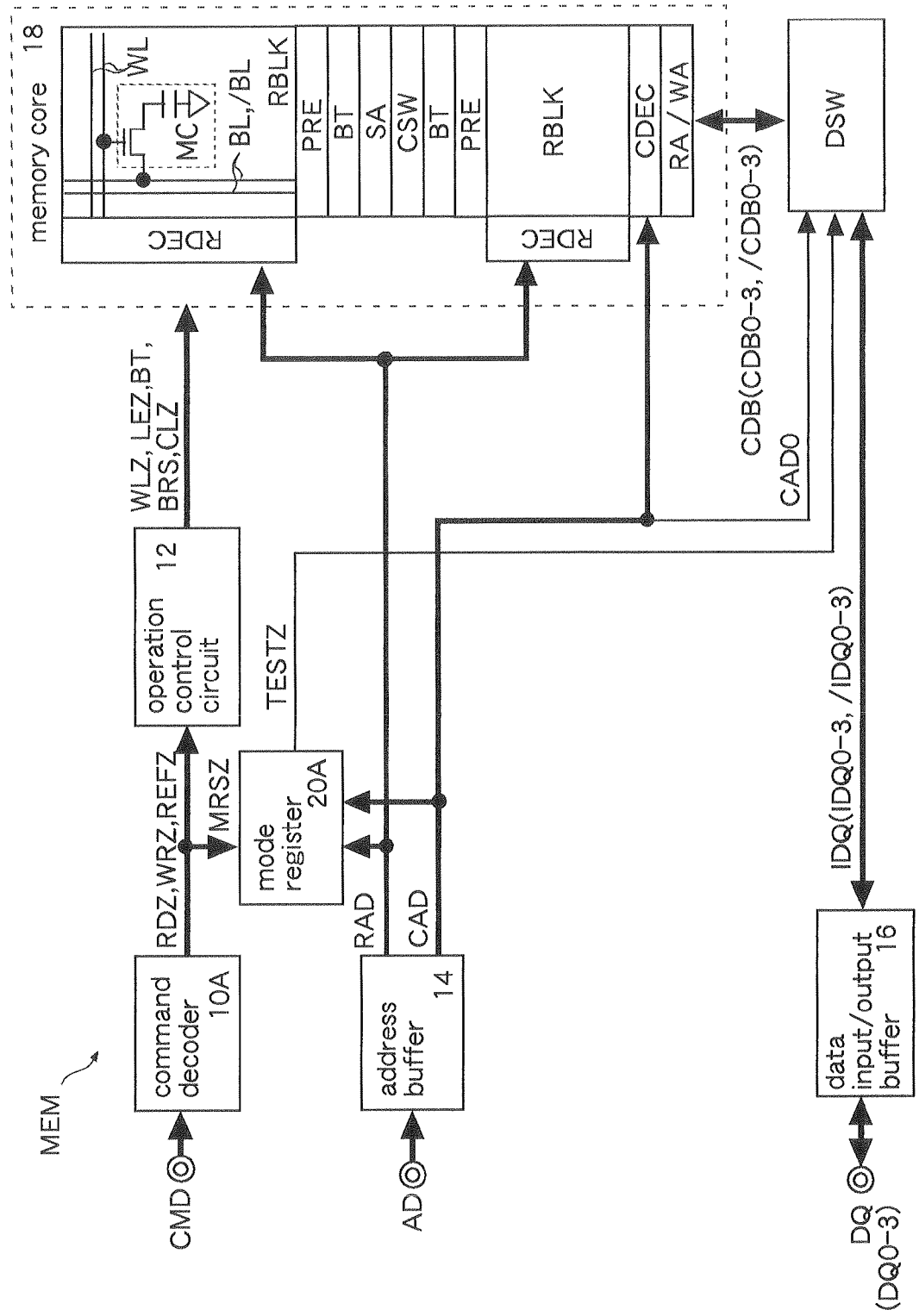
FIG. 14 is a block diagram illustrating a third embodiment of the present embodiment.

FIG. 14 illustrates a third embodiment of the present embodiment. The same elements as those described in the first and second embodiments are denoted by the same reference numerals or letters, and detailed descriptions thereof are omitted. In this embodiment, the test control signal TESTZ is output from a mode register 20A. Further, a command decoder 10A has a function to decode a mode register set command MRSZ in addition to the function of the command decoder 10 of the second embodiment.

The structure excluding the command decoder 10A and the mode register 20A is the same as that in the second embodiment. That is, the semiconductor memory MEM is, for example, a DRAM. The semiconductor memory MEM forms, as illustrated in FIG. 4 and FIG. 5, a system TSYS (or SYS) together with a controller TEST (or CPU). However, the controller TEST controls the operation of the data swap circuit DSW by the command signal CMD and the address signal AD, instead of the test control signal TESTZ.

The mode register 20A activates the test control signal TESTZ when, for example, values of the address signals RAD. CAD supplied together with the mode register set command MRSZ indicate the test mode and also indicate the swap operation of the data swap circuit DSW. The activated test control signal TESTZ is inactivated when values of the address signals RAD, CAD supplied together with the mode register set command MRSZ indicate release of the test mode. This realizes the same operation as the second embodiment. As above, in the third embodiment, the same effects as those in the above-described second embodiment can be obtained.

Figure 15:
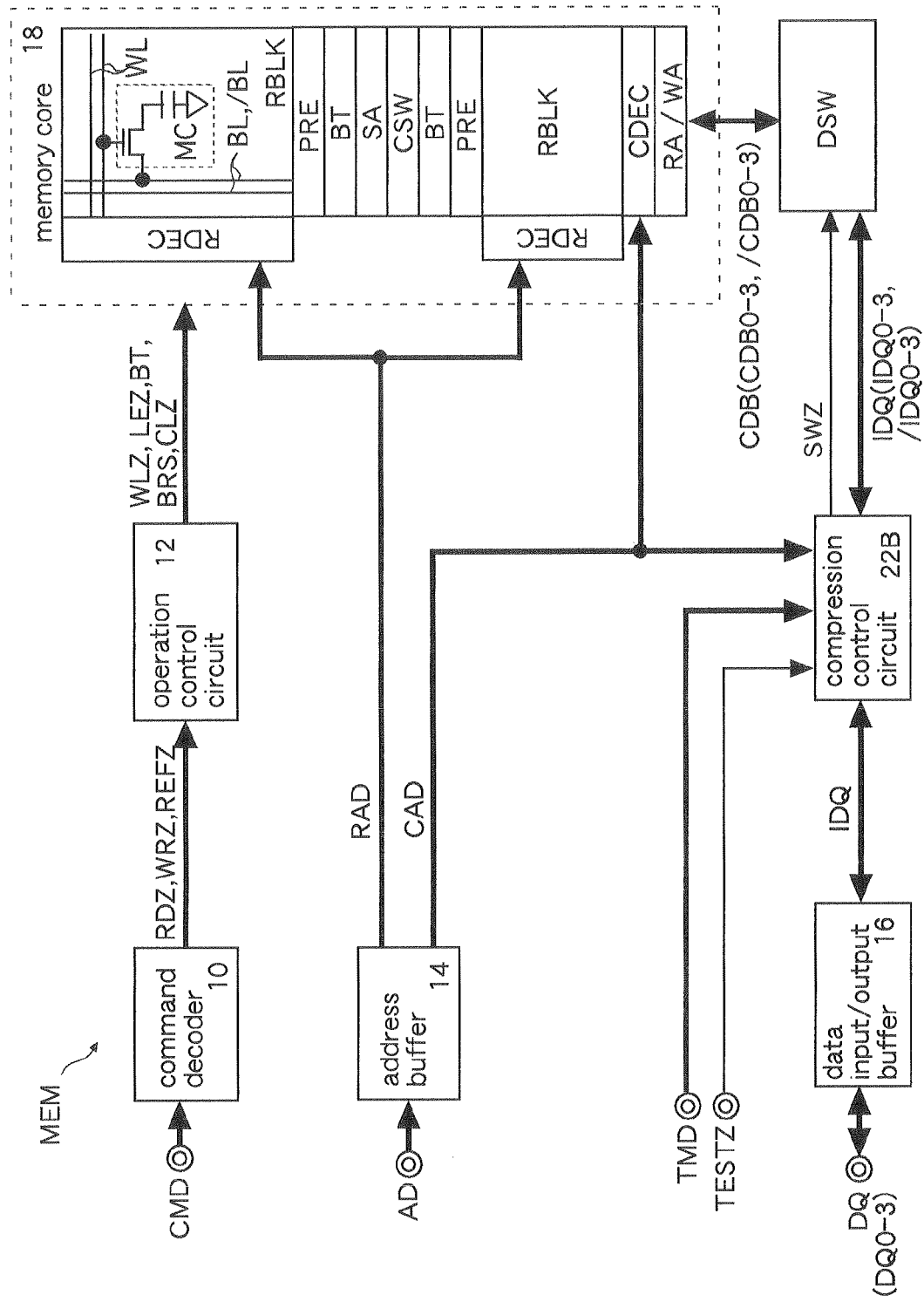
FIG. 15 is a block diagram illustrating a fourth embodiment of the present embodiment.

FIG. 15 illustrates a fourth embodiment of the present embodiment. The same elements as those described in the second embodiment are denoted by the same reference numerals or letters, and detailed descriptions thereof are omitted. In this embodiment, a compression control circuit 22B is provided between the data input/output buffer 16 and the data swap circuit DSW. The other structure is the same as that of the second embodiment. That is, the semiconductor memory MEM is, for example, a DRAM. The semiconductor memory MEM forms, as illustrated in FIG. 4 and FIG. 5, a system TSYS (or SYS) together with a controller TEST (or CPU).

However, in the test system TSYS, the data signal line DQ coupled between the LSI tester TEST and the memory MEM is, for example, only the DQ0. In other words, the memory MEM has a function of what is called a data compression test. Accordingly, the number of data terminals DQ coupled to the LSI tester TEST can be reduced, and the number of memories MEM which can be coupled simultaneously to the LSI tester TEST can be increased as compared to the second embodiment. Consequently, test times and test costs can be reduced.

The data swap circuit DSW performs the swap operation while the swap signal SWZ is activated, and prohibits the swap operation while the swap signal SWZ is inactivated. The swap signal SWZ combines functions of the column address signal CAD0 and the test control signal TESTZ of the second embodiment, and is equivalent to the signal SWZ illustrated in FIG. 8. Therefore, the operation of the data swap circuit DSW in the normal operation is the same as that in the first and second embodiments.

Figure 16:
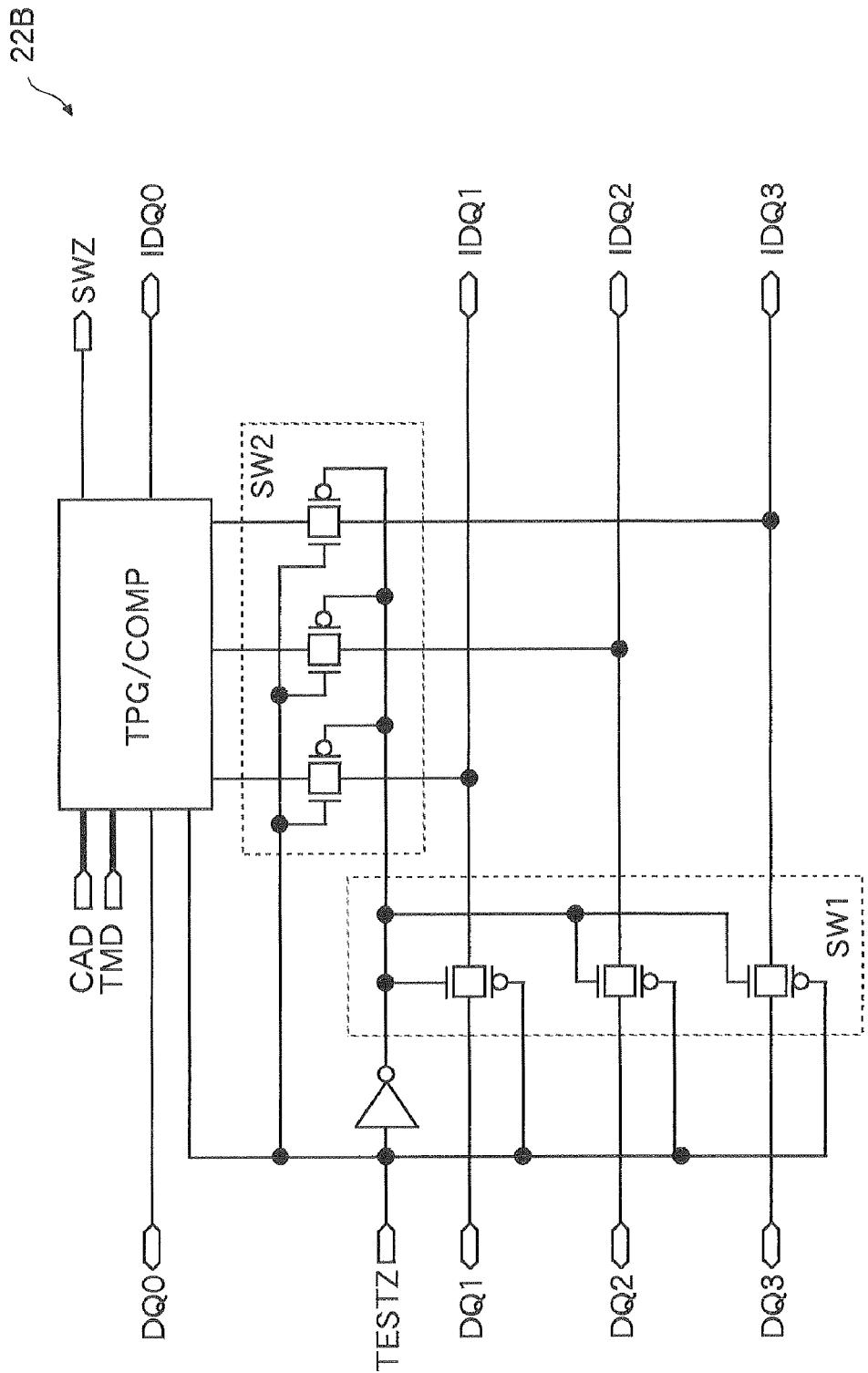
FIG. 16 is a block diagram illustrating a fifth embodiment of the present embodiment.

FIG. 16 illustrates details of the compression control circuit 228 illustrated in FIG. 15. The compression control circuit 22B has a test pattern generator TPG, a test result comparator COMP and switch circuits W1, SW2. Note that in FIG. 16, only data signal lines of positive logic are illustrated, and descriptions of data signal lines of negative logic (for example, /IDQ0-3) are omitted.

The test pattern generator TPG operates while the test control signal TESTZ is activated (while in the test mode) and generates a test pattern (IDQ0-3, /IDQ0-3) of a write data signal to be output to the data swap circuit DSW based on, for example, the column address signal CAD and write data received at the data terminal DQ0. That is, in the stress test illustrated in FIG. 12, the test pattern of the write data signal is generated by the compression control circuit 22B. The test pattern to be generated is different depending on a test mode signal TMD received at a test mode terminal TMD.

Further, when it is judged that the swap operation of the data swap circuit DSW is necessary depending on the test pattern to be generated, the test pattern generator TPG activates the swap signal SWZ. The test pattern generator TPG inactivates the swap signal SWZ during the normal operation mode (TESTZ=L level).

The test result comparator COMP operates while the test control signal TESTZ is activated (while in the test mode) and compares read data from the memory core 18 with expected values and outputs the comparison result as a data signal DQ0. The test result comparator COMP operates corresponding to, for example, the steps S38-S44. S50-56 illustrated in FIG. 12.

The switch circuits SW1, SW2 have CMOS transmission gates which are coupled respectively to the internal data buses IDQ0-3. The switch circuit SW1 turns on during the normal operation mode and turns off during the test mode. The switch circuit SW2 turns off during the normal operation mode and turns on during the test mode. Accordingly, write data signals supplied to the data terminals DQ0-3 during the normal operation mode are output as internal data signals IDQ0-3, /IDQ0-3 to the data swap circuit DSW. A read data signal read from the memory core 18 via the data swap circuit DSW is output to the data terminals DQ0-3. On the other hand, write data signals generated by the test pattern generator TPG in the test mode are output as the internal data signals IDQ0-3, /IDQ0-3 to the data swap circuit DSW. A read data signal read from the memory core 18 via the data swap circuit DSW is output to the test result comparator COMP.

For example, in the test mode, the test pattern generator TPG outputs levels L, H, H, L to the internal data signal lines IDQ0-3 when the data signal supplied to the data terminal DQ0 is at L level, and outputs levels H, L, L. H to the internal data signal lines IDQ0-3 when the data signal supplied to the data terminal DQ0 is at H level. Further, the test pattern generator TPG inactivates the swap signal SWZ when the column address signal CAD=0, and activates the swap signal SWZ when the column address signal CAD=1. Accordingly, the same stress test as that in the second embodiment can be performed.

In this embodiment, a data signal written in the memory cells MC in the test mode is generated by the compression control circuit 22B. Accordingly, whether to perform or prohibit the swap operation cannot be judged from the outside of the memory MEM. By the compression control circuit 22B performing this judgment, test efficiency can be improved and test costs can be reduced also in the semiconductor memory MEM having a data compression function. As above, in the fourth embodiment, the same effects as those in the above-described first embodiment can be obtained.

Figure 17:
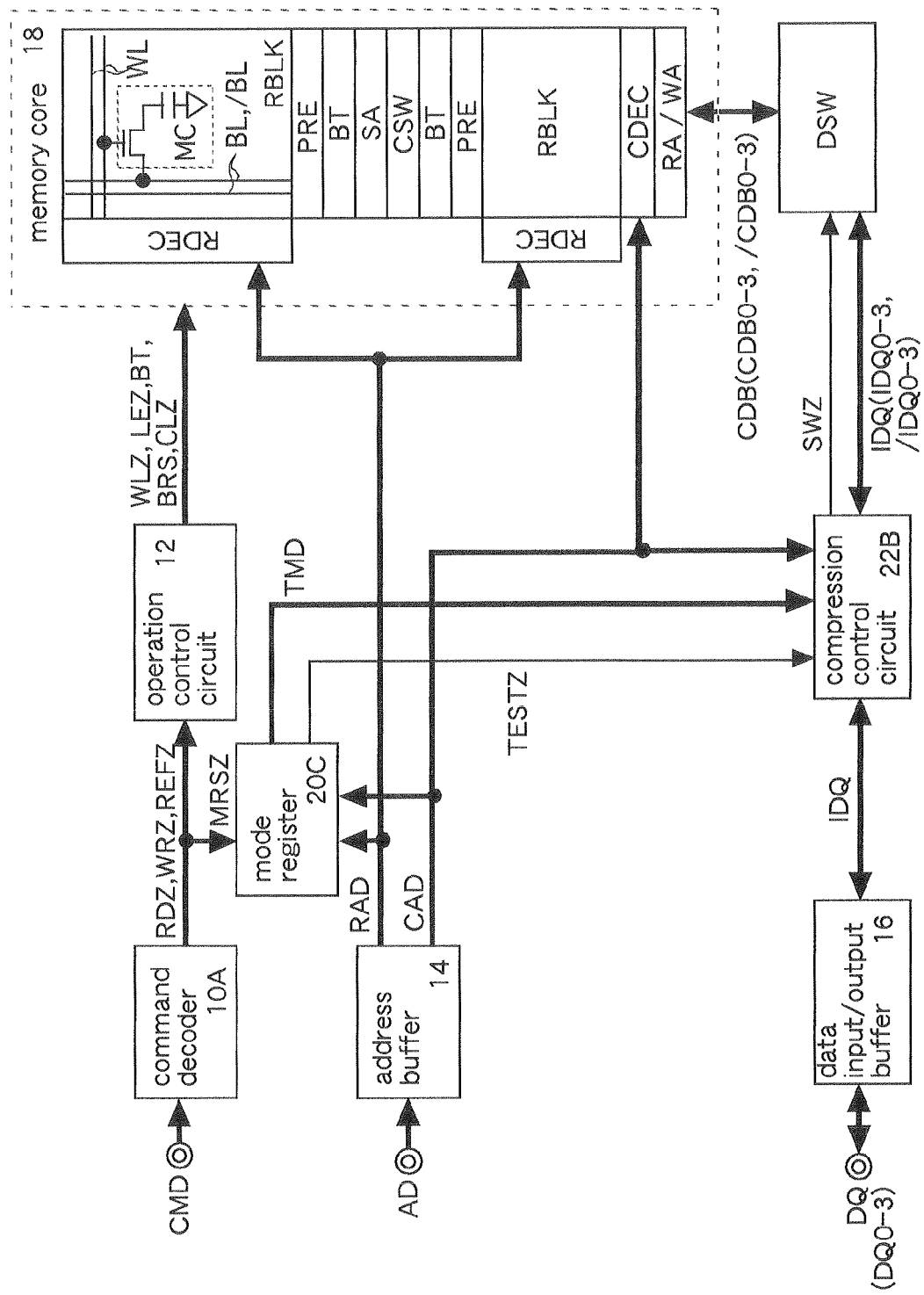
FIG. 17 is a block diagram illustrating a sixth embodiment of the present embodiment.

FIG. 17 illustrates a fifth embodiment of the present embodiment. The same elements as those described in the second, third and fourth embodiments are denoted by the same reference numerals or letters, and detailed descriptions thereof are omitted. In this embodiment, the test control signal TESTZ and the test mode signal TMD are output from a mode register 20C. Further, a command decoder 10A has a function to decode a mode register set command MRSZ in addition to the function of the command decoder 10 of the second embodiment. The structure excluding the command decoder 10A and the mode register 20C is the same as that in the second embodiment. That is, the semiconductor memory MEM is, for example, a DRAM. The semiconductor memory MEM forms, as illustrated in FIG. 4 and FIG. 5, a system TSYS (or SYS) together with a controller TEST (or CPU). However, the controller TEST controls the operation of the data swap circuit DSW and the data compression test by the command signal CMD and the address signal AD, instead of the test control signal TESTZ.

The mode register 20C outputs the test control signal TESTZ and the test mode signal TMD depending on, for example, the values of the address signals RAD, CAD supplied together with the mode register set command MRSZ. Accordingly, the same operation as in the fourth embodiment can be realized. As above, in the fifth embodiment, the same effects as those in the above-described second and fourth embodiments can be obtained.

Note that examples of applying the present embodiment to a DRAM has been described in the above embodiments. The present embodiment is not limited to such embodiments. For example, the present embodiment may be applied to an FCRAM (Fast Cycle RAM), an SRAM or a ferroelectric memory. The FCRAM is a pseudo-SRAM having memory cells of DRAM and an interface of SRAM.

In the above-described fourth and fifth embodiments, examples in which the data swap circuit DSW is operated in conjunction during a data compression test has been described. The present embodiment is not limited to such embodiments. For example, the data swap circuit DSW may be operated independently from the data compression test. Further, a test output terminal outputting the swap signal SWZ to the outside of the memory MEM during the test may be formed in the memory MEM. This allows to monitor the swap signal SWZ by the LSI tester or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor memory, comprising:
   a plurality of data terminals;
   a plurality of complementary bit line pairs extending along a first direction, arranged toward a second direction orthogonal to the first direction, and corresponding to the respective data terminals;
   a plurality of memory cells coupled to respective bit lines of the bit line pairs;
   a plurality of access control circuits each having the bit line pairs wired therein and operating when the memory cells are accessed;
   a contact arranged between the access control circuits adjacent to each other and supplying a voltage to nodes in the access control circuits;
   a plurality of data lines provided corresponding respectively to the respective data terminals and coupled in common to the access control circuits corresponding to the data terminals; and
   a data swap circuit which is arranged between the data lines and the data terminals and swapping connections between a pair of the data terminals and a pair of the data lines corresponding to the pair of the data terminals, wherein:
   at least a pair of the access control circuits adjacent to each other is assigned a same number of a data terminal, and is assigned different addresses; and
   during a test mode, the data swap circuit prohibits swapping of the connections when the memory cells corresponding to one of the access control circuits of a pair are accessed, and swaps the connections when the memory cells corresponding to the other one of the access control circuits of the pair are accessed.

2. The semiconductor memory according to claim 1, wherein
during the test mode, the data swap circuit prohibits or permits swapping of the connections depending on an address signal for selecting the bit line pairs and the access control circuits.

3. The semiconductor memory according to claim 1, wherein
the bit line pairs corresponding to the respective data terminals are arranged in areas separated from each other.

4. The semiconductor memory according to claim 1, wherein:
pairs of the access control circuits corresponding to a pair of the data terminals form a plurality of access control circuit groups which are assigned different addresses;
an order of numbers of data terminals assigned to the access control circuits lined up in the second direction is in reverse order in a pair of the access control circuit groups adjacent to each other; and
among four of the access control circuits in a pair of the access control circuit groups, two of the access control circuits having assigned different addresses and corresponding to one of the data terminals are arranged at positions adjacent to each other.

5. The semiconductor memory according to claim 4, wherein:
the contact is arranged between a pair of the access control circuit groups to supply a voltage to a node in common to the pair of the access control circuit groups; and
a pair of the access control circuit groups adjacent to each other is laid out in a mirror symmetry.

6. The semiconductor memory according to claim 1, further comprising
a write amplifier arranged between the data lines and the data terminals to transmit a write data signal received at the data terminals to the bit lines, wherein
the data swap circuit is arranged between the write amplifier and the data terminals.

7. The semiconductor memory according to claim 1, wherein
the bit lines are wired using a first metal wiring layer; and
the contact is coupled to a wiring wired using a second metal wiring layer located higher than the first metal wiring layer.

8. The semiconductor memory according to claim 1, further comprising a compression control circuit operating during a test mode and generating a write data signal having a plurality of bits based on a data signal supplied to at least one of the data terminals, wherein:
the compression control circuit outputs a swap signal depending on a write data signal to be generated and an address signal for selecting the bit line pairs and the access control circuits; and
the data swap circuit prohibits or permits swapping of the connections depending on the swap signal.

9. A system comprising a semiconductor memory and a controller accessing the semiconductor memory, wherein
the semiconductor memory, comprising:
a plurality of data terminals;
a plurality of complementary bit line pairs extending along a first direction, arranged toward a second direction orthogonal to the first direction, and corresponding to the respective data terminals;
a plurality of memory cells coupled to respective bit lines of the bit line pairs;
a plurality of access control circuits each having the bit line pairs wired therein and operating when the memory cells are accessed;
a contact arranged between the access control circuits adjacent to each other and supplying a voltage to nodes in the access control circuits;
a plurality of data lines provided corresponding respectively to the respective data terminals and coupled in common to the access control circuits corresponding to the data terminals; and
a data swap circuit which is arranged between the data lines and the data terminals and swapping connections between a pair of the data terminals and a pair of the data lines corresponding to the pair of the data terminals, wherein:
at least a pair of the access control circuits adjacent to each other is assigned a same number of a data terminal, and is assigned different addresses; and
during a test mode, the data swap circuit prohibits swapping of the connections when the memory cells corresponding to one of the access control circuits of a pair are accessed, and swaps the connections when the memory cells corresponding to the other one of the access control circuits of the pair are accessed.

10. The system according to claim 9, wherein:
the controller outputs a test control signal to the semiconductor memory; and
the semiconductor memory enters the test mode depending on the test control signal output from the controller.

* * * * *